United States Patent
Kurimoto

(10) Patent No.: US 10,497,826 B2
(45) Date of Patent: Dec. 3, 2019

(54) LIGHT-EMITTING DEVICE AND METHOD OF MANUFACTURING THE SAME

(71) Applicant: NICHIA CORPORATION, Anan-shi, Tokushima (JP)

(72) Inventor: Takeo Kurimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/141,890

(22) Filed: Sep. 25, 2018

(65) Prior Publication Data

US 2019/0027660 A1 Jan. 24, 2019

Related U.S. Application Data

(62) Division of application No. 15/496,559, filed on Apr. 25, 2017, now Pat. No. 10,115,875.

(30) Foreign Application Priority Data

Apr. 26, 2016 (JP) .................. 2016-088286

(51) Int. Cl.
*H01L 33/00* (2010.01)
*H01L 25/13* (2006.01)
*H01L 27/15* (2006.01)
*H01L 33/48* (2010.01)
*H01L 33/54* (2010.01)
(Continued)

(52) U.S. Cl.
CPC ........ *H01L 33/005* (2013.01); *H01L 25/0753* (2013.01); *H01L 25/13* (2013.01); *H01L 27/153* (2013.01); *H01L 27/156* (2013.01); *H01L 33/20* (2013.01); *H01L 33/44* (2013.01); *H01L 33/486* (2013.01); *H01L 33/54* (2013.01); *H01L 2933/005* (2013.01); *H01L 2933/0033* (2013.01)

(58) Field of Classification Search
CPC ................. H01L 25/0753; H01L 25/13; H01L 2933/0033; H01L 2933/005; H01L 27/156; H01L 33/005; H01L 33/52–56
See application file for complete search history.

(56) References Cited

U.S. PATENT DOCUMENTS

2009/0114937 A1  5/2009  Kawakubo
2012/0032197 A1  2/2012  Kurimoto
(Continued)

FOREIGN PATENT DOCUMENTS

JP      H09-6259 A       1/1997
JP      2000-183405 A    6/2000
(Continued)

*Primary Examiner* — Robert G Bachner
*Assistant Examiner* — Molly K Reida
(74) *Attorney, Agent, or Firm* — Hunton Andrews Kurth LLP

(57) ABSTRACT

A method of manufacturing a light emitting device that includes a plurality of light emitting parts is provided. The method includes providing a base member having a plurality of recesses; mounting at least one light-emitting element in each of the plurality of recesses; disposing a light-transmissive layer continuously covering the plurality of recesses; and removing portions of the light-transmissive layer on the lateral wall between adjacent recesses to expose corresponding portions of the lateral wall, to obtain a plurality of light-transmissive members.

15 Claims, 14 Drawing Sheets

(51) Int. Cl.
*H01L 25/075* (2006.01)
*H01L 33/20* (2010.01)
*H01L 33/44* (2010.01)

(56) References Cited

U.S. PATENT DOCUMENTS

2014/0284652 A1* 9/2014 Shimada ................. H01L 33/56
                                                        257/99
2014/0291710 A1   10/2014  Kurimoto
2015/0221623 A1    8/2015  Tischler et al.
2015/0221835 A1    8/2015  Tischler et al.
2017/0037312 A1    2/2017  Fujii et al.

FOREIGN PATENT DOCUMENTS

| | | |
|---|---|---|
| JP | 2009-117536 A | 5/2009 |
| JP | 2009-122503 A | 6/2009 |
| JP | 2012-054533 A | 3/2012 |
| JP | 2013-219260 A | 10/2013 |
| JP | 2015-201472 A | 11/2015 |
| JP | 2015-201473 A | 11/2015 |
| JP | 2016-216355 A | 12/2015 |

* cited by examiner

LIGHT-EMITTING DEVICE AND METHOD OF MANUFACTURING THE SAME

CROSS-REFERENCE TO RELATED APPLICATION

This is a divisional application of U.S. patent application Ser. No. 15/496,559, filed Apr. 25, 2017, which claims priority to Japanese Patent Application No. 2016-088286 filed on Apr. 26, 2016, the entire disclosures of which are hereby incorporated by reference.

BACKGROUND

Technical Field

The present disclosure relates to a light-emitting device and a method of manufacturing the device.

Description of Related Art

Light-emitting devices, which have a light-emitting diode (LED) mounted in a recess defined in a base member and a light-transmissive resin disposed over the recess, are known. See, for example, Japanese Unexamined Patent Publications No. 2009-117536, No. 2013-219260, No. 2012-54533, No. 2000-183405, No. 2009-122503, and No. H9-6259. The light-emitting devices disclosed in Japanese Unexamined Patent Publications No. 2009-117536 and No. 2013-219260 are intended to be used mainly for lighting, and the light-emitting devices disclosed in Japanese Unexamined Patent Publications No. 2012-54533, No. 2000-183405, No. 2009-122503, and No. H9-6259 are intended to be used mainly for displays.

SUMMARY

In recent years, higher definition has been required in large-size displays such as street displays.

Accordingly, it is an object of the present disclosure to provide a light-emitting device suitable for use in a high-definition display device and the like, and also to provide a method of manufacturing such a device.

A method of manufacturing a light emitting device having a plurality of light emitting parts according to certain embodiments of the present disclosure includes: providing a base member defining a plurality of recesses each defined by a bottom surface and lateral surfaces that are respectively inner lateral surfaces of a lateral wall separating adjacent recesses; mounting at least one light-emitting element in each of the plurality of recesses; forming a light-transmissive layer continuously covering the plurality of recesses; and at least partially removing portions of the light-transmissive layer on the lateral wall between adjacent recesses to expose at least portions of the lateral wall to form a plurality of light-transmissive members.

A light-emitting device having a plurality of light emitting parts according to certain embodiments of the present disclosure includes a base member having a plurality of recesses each defined by a bottom surface and lateral surfaces that are inner lateral surfaces of a lateral wall separating adjacent recesses, at least one light-emitting element mounted in each of the plurality of recesses, and a plurality of light-transmissive members each having a flat upper surface and covering respective one of the plurality of recesses. The plurality of light-transmissive members are separated from each other by the lateral wall separating adjacent recesses, and the upper surface of each of the plurality of light-transmissive members is located higher than an uppermost portion of the lateral wall.

The present disclosure provides a light-emitting device suitable for use in a high-definition display device and the like, and also to provide a method of manufacturing such a device.

DETAILED DESCRIPTION

Embodiments of the present disclosure will now be described in detail with reference to the accompanying drawings. In the description below, terms indicative of particular directions and locations, such as "up," "down," "right," "left," and other terms including any of these terms, will be used as needed. It should be noted that those terms are used for easy understanding of the present disclosure with reference to the accompanying drawings, and thus the technical scope of the present disclosure shall not be limited by the meaning of those terms. The same numerals in different drawings indicate the same or similar portions or members.

The present disclosure provides a method of manufacturing a light emitting device with simplified manufacturing steps, particularly in a step of forming a light-transmissive member, to achieve a reduction in the cost of manufacturing. According to the present disclosure, a light-transmissive layer is formed to cover a plurality of first recesses defined in a base member, and then portions of the light-transmissive layer are removed along lateral wall defining the plurality of first recesses. Thus, a plurality of light-transmissive members each covering respective one of the plurality of first recesses can be simultaneously formed.

In the description below, various exemplary configurations for light-emitting devices will be described first, and then exemplary manufacturing processes thereof will be described.

First Embodiment

Figure 1A:
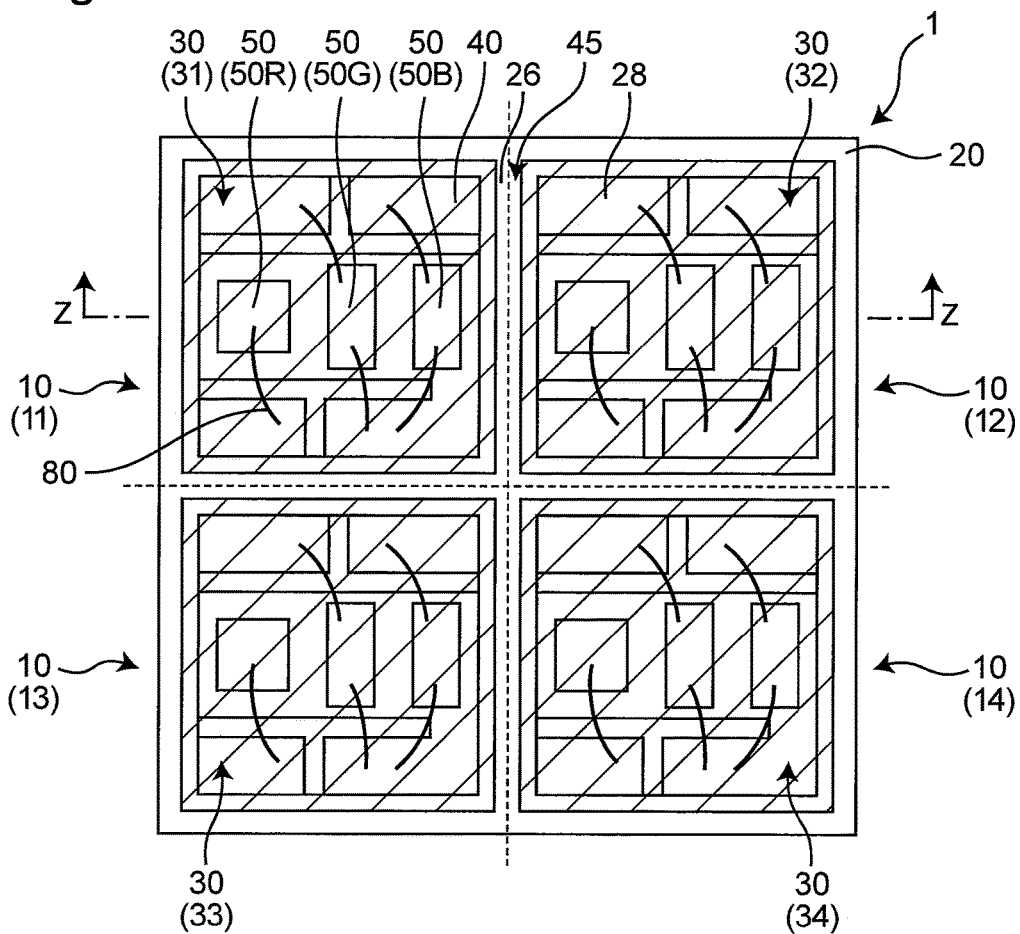
FIG. 1A is a schematic plan view illustrating a light-emitting device according to a first embodiment of the present disclosure.
Figure 1B:
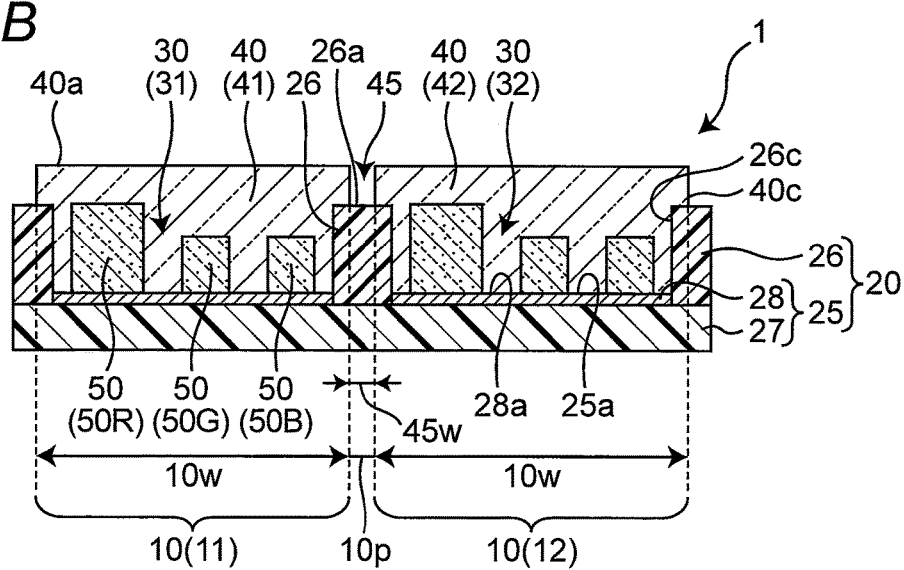
FIG. 1B is a schematic cross-sectional view taken along line Z-Z shown in FIG. 1A.

FIG. 1A is a schematic plan view illustrating a light-emitting device 1 according to a first embodiment of the present disclosure, and FIG. 1B is a schematic cross-sectional view taken along line Z-Z of FIG. 1A.

The light-emitting device 1 includes a base member 20 having a plurality of first recesses 30, light-emitting elements 50 mounted in each of the plurality of first recesses 30, and a plurality of light-transmissive members 40 each having a flat upper surface and covering respective one of the plurality of first recesses 30. Adjacent light-transmissive members 40 are separated from each other by a lateral wall 26 between the first recesses 30, and the upper surfaces of the light-transmissive members 40 are located higher than the uppermost portion of the lateral wall 26.

The base member 20 includes a substrate 25 providing portions each defining the bottom of each of the first recesses 30, and the lateral wall 26 formed on the upper surface of the substrate 25 and including inner lateral surfaces defining lateral surfaces of each of the first recesses 30. The lateral wall 26 is arranged to separate the first recesses 30 from each other, and the inner lateral surfaces 26c of the lateral wall 26 define lateral surfaces of each of the first recesses 30. In the example shown in FIG. 1A, the light-emitting device 1 has four first recesses 31, 32, 33, and 34. The upper surface 25a of the substrate 25 defines the bottom surfaces of the recesses 31, 32, 33, and 34, and the inner lateral surfaces 26c of the lateral wall 26 define lateral surfaces of each of the first recesses 31, 32, 33, and 34.

The substrate 25 may include a plate-shaped member 27 and wiring electrodes 28 arranged on the upper surface thereof, for example. When the substrate 25 includes the wiring electrodes 28, the upper surfaces 28a of the wiring electrodes 28 serve as parts of the upper surface 25a of the substrate 25.

At least one light-emitting element 50 is mounted in each of the first recesses 30. In the example shown in FIGS. 1A and 1B, a plurality of light-emitting elements 50 are mounted in each of the first recesses, and three colors of light emitting elements: a red light-emitting element 50R, a green light-emitting element 50G, and a blue light-emitting element 50B are employed for the light emitting elements 50. The red light-emitting element 50R has either positive electrode or negative electrodes on the bottom or upper surfaces thereof, respectively. Either the positive or negative electrode is connected to respective corresponding wiring electrode 28 of the substrate 25, and the other is connected to respective corresponding wiring electrode 28 via a conductive wire 80. The green light-emitting element 50G and the blue light-emitting element 50B respectively have positive and negative electrodes on the upper surface thereof, and the electrodes are connected to the wiring electrodes 28 via conductive wires 80, respectively.

The first recesses 30 are respectively covered by the light-transmissive members 40 which are separated from each other. The light-transmissive members 40 are filled in each of the first recesses 30 to cover the bottom surface and inner lateral surfaces of the lateral wall 26 defining the first recess 30 and the light-emitting elements 50 mounted in the first recess 30. As shown in FIGS. 1A and 1B, the light-transmissive member 41 covering the first recess 31 and the light-transmissive member 42 covering the first recess 32 adjacent to the first recess 31 are separated from each other by the lateral wall 26.

As shown in FIG. 1A, the light-emitting device 1 is provided with grooves 45 between adjacent light-transmissive members 40. The grooves 45 are formed along the lateral wall 26, in an upper surface 40a of the light-transmissive member 40 to a depth reaching the upper surface 26a of the lateral wall 26. In other words, at least portions of the bottom surfaces defining the grooves 45 are the upper surface 26a of the lateral wall 26.

As shown in FIGS. 1A and 1B, the light-emitting device 1 includes a plurality of light emitting parts 11, 12, 13, and 14, which may be hereinafter collectively referred to as "light emitting part(s) 10". In the present specification, each "light emitting part 10" includes, as its major components, a single first recess, at least one light-emitting element mounted in the first recess, and the light-transmissive member 40 covering the first recess. For example, the light emitting part 10 includes the first recess 31, three light-emitting elements 50R, 50G, and 50B arranged in the first recess 31, and the light-transmissive member 41 covering the first recess 31.

In FIG. 1B, the width 10w of each light emitting part 10 corresponds to the width of its light-transmissive member 40. This is because the lateral surfaces 40c of the light-transmissive member 40 are located at the outer sides with respect to the inner lateral surfaces 26c of the lateral wall 26 that define each of the first recess 30. Thus, in the light-emitting device 1, the interval 10p between adjacent light emitting parts 10 corresponds to the interval between adjacent light-transmissive members 40, i.e., the width of the grooves 45.

As described above, the light-emitting device 1 includes a plurality of first recesses 30. In each of the plurality of first recesses 30, at least one light-emitting element 50 and the light-transmissive member 40, etc., are arranged to constitute a single light emitting part. When the light-emitting device 1 is used in a display device, a single light emitting part can serve as a single pixel portion of the display device. That is, a single light-emitting device 1 can provide a plurality of constituent pixel portions of a display device. This allow for a reduction in the number of light emitting devices to be arranged on a mounting substrate, which in turn allows for a reduction in assembly costs. Further, this also allows for arrangement of a plurality of light emitting parts in close proximity to one another on a single base member, which is appropriate for manufacturing a high-definition display device.

In the example illustrated in FIGS. 1A and 1B, four light emitting parts are provided in a two-by-two array in a single light-emitting device 1, but five or more light emitting parts may be provided in the light emitting device 1. In particular, when the light emitting device 1 is used in a display device the light-emitting device 1 preferably includes a plurality of light emitting parts arranged in a matrix of columns and rows. It is more preferable that the number of columns and rows are a power of two, which may be 16×16, 16×32, 32×32, or 16×64, for example.

As shown in FIGS. 1A and 1B, the first recess 31 of the first light emitting part 11 and the first recess 32 of the second light emitting part 12 are separated from each other by the lateral wall 26 arranged therebetween. Thus, when the light-emitting elements 50 of the first light emitting part 11 are turned on, the light emitted from the light-emitting elements 50 is blocked by the lateral wall 26 and not allowed to enter the first recess 32 of the second light emitting part 12. In a similar manner, when the light-emitting elements 50 of the second light emitting part 12 are turned on, the light emitted from the light-emitting elements 50 is blocked by the lateral wall 26 and hardly enter the first recess 31 of the first light emitting part 11. That is, the use of a single light emitting part of the light-emitting device 1 corresponding to a single pixel of a display image can reduce occurrence of so-called "pseudo-lighting", a phenomenon that occurs when one of two adjacent pixel portions is in on-state and the other pixel portion is in off-state, the pixel that is in off-state may appear to emit light.

The first light-transmissive member 41 of the first light emitting part 11 and the second light-transmissive member 42 of the second light emitting part 12 are separated from each other by the lateral wall 26. In other words, the first light-transmissive member 41 and the second light-transmissive member 42 are adjacent to each other with the lateral wall 26 therebetween. When the light-emitting elements 50 arranged in the light-transmissive members emit light, each of the light-transmissive members can serve as a light guide member that allows the light propagating therethrough. Thus, if the first light-transmissive member 41 and the second light-transmissive member 42 were continuous with each other, light emitted from the light-emitting elements 50 of the first light emitting part 11 can propagate through the first light-transmissive member 41 to the second light-transmissive member 42. In such a case, when the first light emitting part 11 is turned on, the second light emitting part 12 that is in off-state may appear to emit light.

However, in the light-emitting device 1 of the present disclosure, groove 45 is formed between the first light-transmissive member 41 and the second light-transmissive member 42. That is, the first light-transmissive member 41 and the second light-transmissive member 42, which are located higher than the uppermost portion of the lateral wall 26, are separated from each other by the groove 45. With this arrangement, when the light emitting elements 50 of the first light emitting part 11 are turned on, propagation of the light from the first light-transmissive member 41 into the second light-transmissive member 42 can be reduced. Accordingly, occurrence of pseudo-lighting can be reduced.

The groove 45 is formed with a depth reaching the upper surface of the lateral wall 26. In other words, at least a portion of the bottom surface of the groove 45 is defined by the upper surface of the lateral wall 26. Accordingly, when the light-emitting device 1 is viewed from a viewing side, a portion of the upper surface 26a of the lateral wall 26 can be visually recognized at the bottom surface of the groove 45. As a result, when the light-emitting device 1 is used in a display device, that is when the light-emitting device 1 is viewed from a viewing side, adjacent light emitting parts can be visually recognized as being separated from one another by the upper surfaces 26a of the lateral wall 26. With this arrangement, stronger outlines of the light emitting parts can be obtained, thus increasing the sharpness of the image on the display. With the lateral wall 26 of a dark color, e.g., a black color, a display image having a high contrast ratio can be obtained.

As shown in FIG. 1B, the upper surface 26a of the lateral wall 26 may be partially covered by the light-transmissive members 40. Under a humid environment, water may enter the light emitting device 1 from the grooves 45 through interfaces between the lateral wall 26 and the light-transmissive members 40, which may cause malfunction. However, when portions of the upper surface 26a of the lateral wall 26 are partially covered by the light-transmissive members 40, the distance of water entering the recesses 30 can be increased by the interfaces between the upper surfaces 26a of the lateral walls 26 and the light-transmissive members 40. With this configuration, the amount of water entering in the recesses 30 can be reduced, which in turn can reduce degradation of the light emitting device 1. Accordingly, a highly reliable light-emitting device 1 with a longer operation life can be provided.

The upper surfaces 40a of the light-transmissive members 40 may have various shapes such as a protruded shape, a recessed shape, and a flat shape; of those, a flat shape is preferable. In the case where the upper surfaces 40a are formed in a flat shape, a plurality of light-transmissive members 40 of the light emitting device 1 can be formed through a simple process while obtaining the upper surfaces 40a of the light-transmissive members 40 with a tighter range of tolerance in terms of dimension and shape.

For example, filling the first recesses 30 with the light-transmissive member 40 in the first recesses 30 is carried out by applying a liquid resin material of the light-transmissive members 40 dropwise into the first recesses 30 and then curing the liquid resin material. In this case, when a larger drop of the liquid resin material is applied, the surface tension of the liquid resin material causes its surface to bulge, so that upon curing, a bulged upper surface 40a can be obtained. Meanwhile, when a smaller drop of the liquid resin material is applied, the liquid resin material raises up along the lateral surfaces defining the first recess 30, so that upon subsequent curing, a concaved upper surface 40a can be obtained.

The shape and dimensions of the upper surface 40a may vary easily with even a slight fluctuation in the dropping amount of the liquid resin material, and/or with a slight variation in the characteristics of the surfaces defining the first recesses 30. That is, a slight change in the wettability of the liquid resin material with respect to the lateral surfaces defining the first recesses 30 may cause a variation in the dimensions and shapes of the upper surfaces 40a, which may lead to variation in the directivity of light of the plurality of light emitting parts 10 in the light emitting device 1.

Examples of methods to form the light transmissive members 40 having protruded upper surfaces or concaved upper surfaces include filling the first recesses 30 with the light-transmissive material using a mold assembly. In this case, precise positioning is required so that the centers of the first recesses 30 and the corresponding centers of the mold assembly are accurately aligned.

In contrast, when forming the light transmissive members 40 having flat upper surfaces 40a, a flat mold can be used, which does not require precise positioning of the centers of the first recesses 30 and the corresponding portions of the mold. Further, the use of a mold assembly can eliminate occurrence of variation in the shapes and dimensions of the upper surfaces 40a that may occur when the liquid resin material is applied by dropping. Thus, forming the upper surfaces 40a of the light-transmitting members 40 of the light-emitting device 1 into a flat shape allows simplifying the manufacturing steps and reduction of variation in the optical directivity of the light-emitting devices 1. In particular, when the light emitting device 1 is used for a display, small variation in the optical directivity of the light emitting parts 10 allows for obtaining a display having small unevenness in the luminance and color.

In the present specification, the term "flat" refers to a condition where protrusions and/or recesses that can significantly affect the directivity of light (mainly in terms of viewing angle) are absent. In this regard, presence of minute protrusions and/or recesses formed by surface roughening or the like can be assumed "flat" in the present specification, unless it causes a significant change in the optical directivity. More specifically, a surface with a surface roughness Ra of 10 μm or less does not practically affect the directivity of light, so that it can be assumed flat. When the light-emitting device 1 is used for a display, roughening the upper surfaces 40a (for example, to a surface roughness Ra in a range of 1 to 10 μm) can reduce generation of glare (lights).

If an upper surface 50a (see FIGS. 2A to 2C) of at least one of the light-emitting elements 50 is located higher than the upper surfaces 26a of the corresponding lateral wall 26, the viewing angle increases, but if the upper surface 50a of the light-emitting element 50 is located significantly higher than the upper surfaces 26a of the corresponding lateral wall 26, light-blocking effect of the lateral wall decreases and pseudo-lighting may occur. If the upper surface 50a of at least one of the light-emitting elements 50 is located lower than the upper surfaces 26a of the corresponding lateral wall 26, the light-blocking effect of the lateral wall 26 increases, but if the upper surface 50a of the light-emitting element 50 is located significantly lower than the upper surfaces 26a of the corresponding lateral wall 26, the viewing angle decreases. Thus, in order to obtain a good balance of the light-blocking effect and the viewing angle, it is preferable that the heights of the upper surfaces 50a of the light emitting elements 50 are not significantly different from the heights of the upper surfaces 26a of the lateral wall 26.

In order to determine the difference in the height of the upper surfaces 50a of the light-emitting elements 50 and the upper surfaces 26a of the lateral wall 26, a tangent line is assumed by the upper surface 50a of one of the light emitting elements 50 and the upper surface 26a of one of the lateral wall 26. More specifically, the angle formed by the tangent line and the upper surface 25a of the substrate 25 (hereinafter referred to as the "tilt angle of the tangent line") is used. Now with reference to FIGS. 2A to 2C, tangent lines passing through respective points on the upper surface 50a of the light emitting element 50 and points on the upper surfaces 26a of the lateral wall 26, and the corresponding tilt angles of the tangent lines will be described.

Figure 2A:
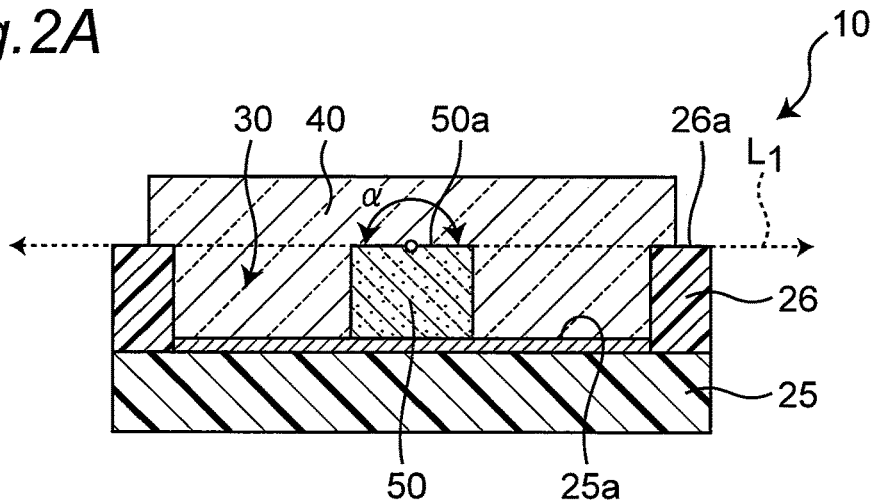
FIGS. 2A, 2B, and 2C are schematic cross-sectional views of the light-emitting device according to the first embodiment.
Figure 2B:
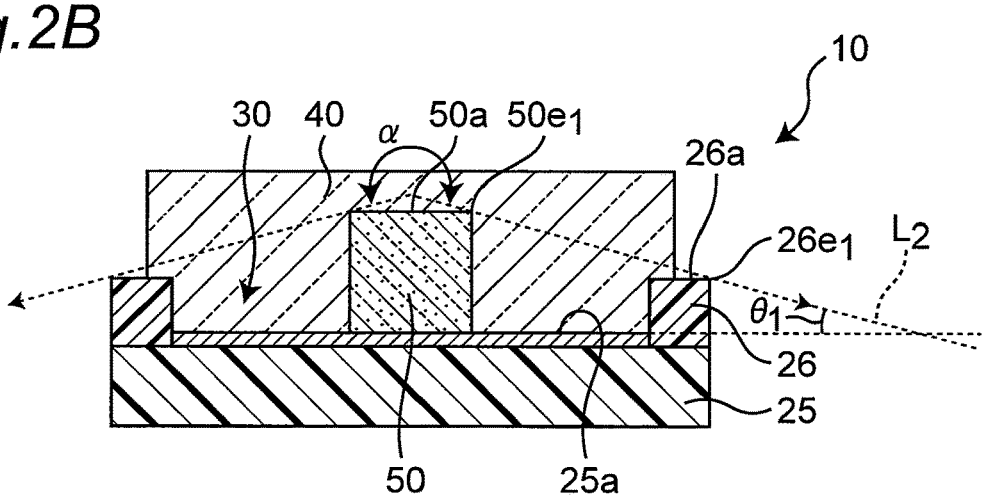
Figure 2C:
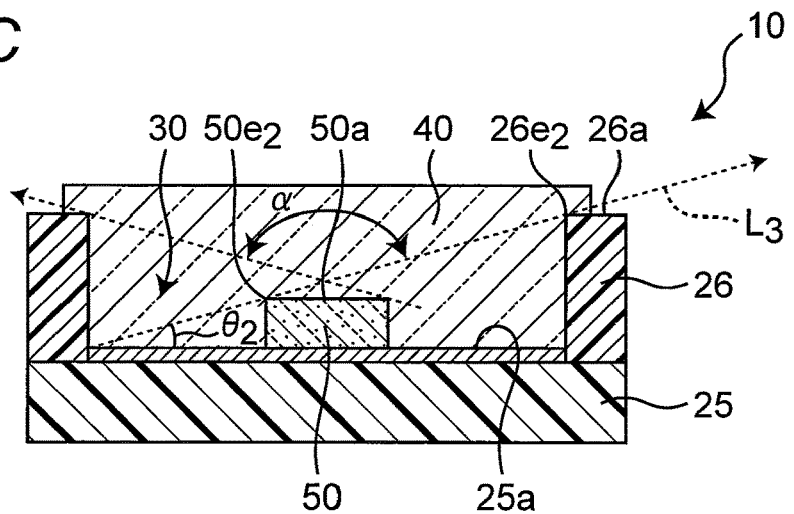

FIGS. 2A, 2B, and 2C are schematic cross-sectional views each showing one of the light emitting parts 10 included in the light-emitting device 1.

In each of the cross-sectional views shown in FIGS. 2A to 2C, the upper surface 50a of the light emitting element 50 has an edge $50e_1$ (a proximate edge $50e_1$) proximate to the lateral wall 26 and an edge $50e_2$ (distal edge $50e_2$) distal to the lateral wall 26, and the upper surfaces 26a of the lateral wall respectively have an edge $26e_1$ distal to the light emitting element 50 and an edge $26e_2$ proximate to the light emitting element 50.

In the light emitting part 10 shown in FIG. 2A, the upper surface 50a of the light-emitting element 50 is substantially flush with the upper surfaces 26a of the lateral wall 26. In this example, a straight line passing through the upper surface 50a of the light-emitting element 50 and the upper surfaces 26a of the lateral wall 26 is indicated as (defined as) the tangent line $L_1$. Since the tangent line $L_1$ is parallel to the upper surface 25a of the substrate 25, the angle formed by the tangent line $L_1$ and the upper surface 25a (i.e., tilt angle of the tangent line) is 0°. Accordingly, the light emitting part 10 has a viewing angle α of 180°.

In the light emitting part 10 shown in FIG. 2B, the upper surface 50a of the light-emitting element 50 is located higher than the upper surfaces 26a of the lateral wall 26. In this example, a tangent line $L_2$ is a straight line passing through a point on the proximate edge $50e_1$ of the upper surface 50a of the light-emitting element 50 and a point on the distal edge $26e_1$ of the upper surface 26a of the lateral wall 26. The tangent line $L_2$ slopes down outward. The angle formed by the tangent line $L_2$ and the upper surface 25a (i.e., tilt angle of the tangent line) is $\theta_1$. The viewing angle α of the light emitting part 10 is $180°+2\times\theta_1$. In this example, the lateral wall 26 have a small height, which may lead to insufficient blocking of light, in other words, may cause pseudo lighting in an adjacent light emitting part 10.

In the light emitting part 10 shown in FIG. 2C, the upper surface 50a of the light-emitting element 50 is located lower than the upper surfaces 26a of the lateral wall 26. In this example, a tangent line $L_3$ a straight line passing through a point on the distal edge $50e_2$ of the upper surface 50a of the light-emitting element 50 and a point on the proximate edge $26e_2$ of the upper surface 26a of the lateral wall 26. The tangent line $L_3$ slopes upward. The angle formed by the tangent line $L_3$ and the upper surface 25a (i.e., tilt angle of the tangent line) is $\theta_2$. The viewing angle α of the light emitting part 10 is $180°-2\times\theta_2$. In this example, the lateral wall 26 have a large height, which may lead to a reduction in the directivity. That is, when applied to a display, visibility from an oblique direction may be reduced.

In a cross-sectional view of the light emitting part 10 as shown in FIG. 2B, it is preferable that the angle $\theta_1$ be in a range of 0° to 5°, because the decrease in the blocking of light due to the height of the lateral wall 26 can be reduced, and thus occurrence of pseudo-lighting can be reduced. Meanwhile, in a cross-sectional view of the light emitting part 10 as shown in FIG. 2C, when the angle $\theta_2$ is in a range of 0° to 5°, a wide viewing angle α of 170° or greater can be achieved that allows for manufacturing of displays with wide viewing angles. That is, in a cross sectional view of the light emitting device, when an angle formed by a tangent line passing a point on the upper surface 26a of the lateral wall 26 and a point on the upper surface 50a of the light emitting element 50 and the upper surface 25a of the substrate 25 (i.e., tilt angle of the tangent line) is in a range of 0° to 5°, the light emitting device having a good balance of the viewing angle and the light-blocking properties can be obtained.

In the examples shown in FIGS. 2A to 2C, tangent lines are determined with respect to a single light emitting part 10 that includes a single light-emitting element 50. When the single light emitting part 10 includes a plurality of light-emitting elements 50, the tangent line is determined for each of the light-emitting elements 50, preferably with a tilt angle of 5° or less. When the plurality of light-emitting elements 50 has different heights, the tangent line can be determined for a highest light emitting element 50, with the tilt angle of 5° or less, which allows for obtaining an extended definition display device with reduced pseudo-lighting.

The upper surfaces 40a of the light-transmissive members 40 are located higher than the uppermost portion 26t of the lateral wall 26. In other words, the light-transmissive members 40 protrude from the first recesses 30. In the present specification, the term "uppermost portion 26t of lateral wall 26" refers to a highest portion of the lateral wall 26 with reference to the upper surface 25a of the substrate 25. When the upper surfaces 26a of the lateral walls 26 are flat as shown in FIG. 1B, the uppermost portion 26t corresponds to the entire upper surface 26a.

The portions of the light-transmissive members 40 protruding with respect to a plane including the upper surfaces 26a of the lateral walls 26 can contribute to directing the light emitted from the light-emitting element 50 to the outside of the first recesses 30. In particular, when the light-emitting device 1 is used for a display, the viewing angle of the display can be increased by the protruding portions.

Figure 3:
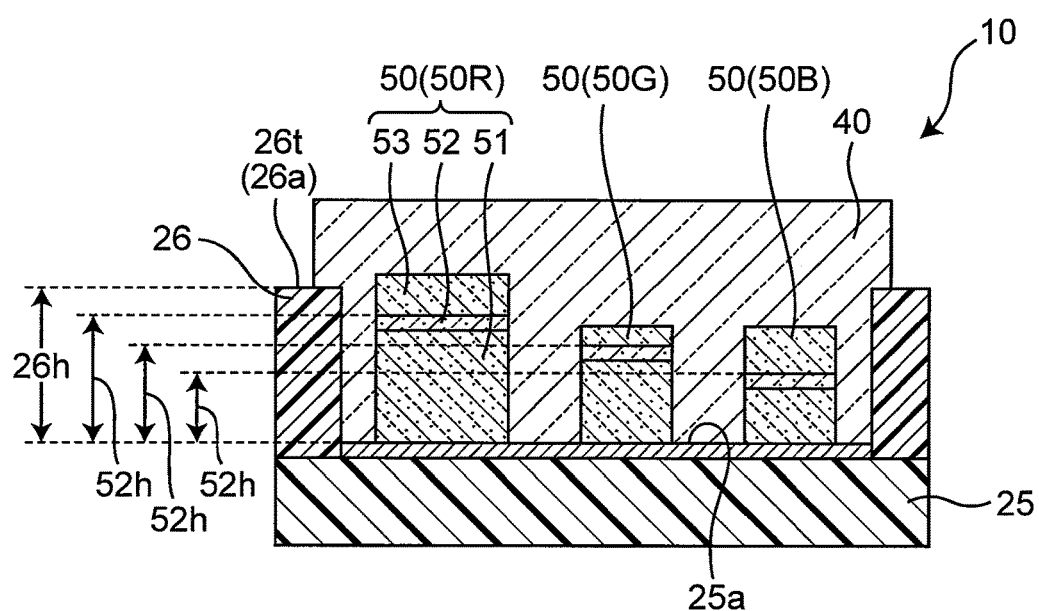
FIG. 3 is a schematic cross-sectional view illustrating a light emitting part of the light-emitting device according to the first embodiment.

As shown in FIG. 3, the light-emitting elements 50 may be semiconductor light-emitting elements having a first conductivity-type semiconductor layer 51, an active layer 52, and a second conductivity-type semiconductor layer 53 layered in this order. The first conductivity-type semiconductor layer 51 may be, for example, an n-type semiconductor layer, and the second conductivity-type semiconductor layer 53 may be, for example, a p-type semiconductor layer.

The light emitted from the active layer 52 has a higher intensity than, for example, the light propagated through the light-transmissive member 40. It is, therefore, of significance that the light emitting parts are not directly irradiated by the light emitted from the active layers 52 of adjacent light emitting parts. Thus, the heights 26h of the sidewalls 26 are preferably appropriately greater than the heights 52h of the active layers 52 of the light-emitting elements 50.

In the present specification, the term "height 26h of the lateral wall 26" refers to the height of the uppermost portion 26t of the lateral wall 26 from the upper surface 25a of the substrate 25. When the lateral wall 26 has a flat upper surface 26a, the height 26h of the lateral wall 26 is the height of the upper surface 26a of the lateral wall 26 from the upper surface 25a of the substrate 25. Also, the term "height 52h of the active layer 52" refers to the height of the highest portion of the active layer 52 from the upper surface 25a of the substrate 25.

When the height 26h of the lateral wall 26 is greater than the heights 52h of the active layers 52 of the light-emitting elements 50 (in other words, the uppermost portion 26t of the lateral wall 26 is located higher than the active layers 52 of the light-emitting elements 50), light emitted from the active layers 52 of the light emitting elements 50 in the lighting part 10 can be prevented from directly entering the recesses 30 of the light emitting parts 10 of adjacent light emitting parts 10. Accordingly, when the light emitting device 1 is used for a display, occurrence of pseudo-lighting can be reduced.

When a single light emitting part 10 includes a plurality of light-emitting elements 50 of different emission colors, the light emitting elements 50 may have active layers 52 of different heights 52h, respectively. In this case, the uppermost portion 26t of the lateral wall 26 is preferably located higher than any of the active layers 52 of the light-emitting elements 50. With this configuration, the shielding effect of the lateral wall 26 can be improved. For example, in the example illustrated in FIG. 3, a single light emitting part 10 includes three light-emitting elements 50R, 50G, and 50B, and the uppermost portion 26t of the lateral wall 26 are located higher than any of the active layers 52.

Next, an exemplary method of manufacturing such a light-emitting device will be described with reference to FIGS. 4A to 4F, and FIGS. 5A to 5F.

Providing Base Member 20

In a step of providing a base member 20, a base member defining a plurality of first recesses 30 is provided. The step of providing the base member 20 includes providing a substrate 25, and forming a lateral wall 26 on an upper surface 25a of the substrate 25.

Providing Substrate 25

Figure 4A:
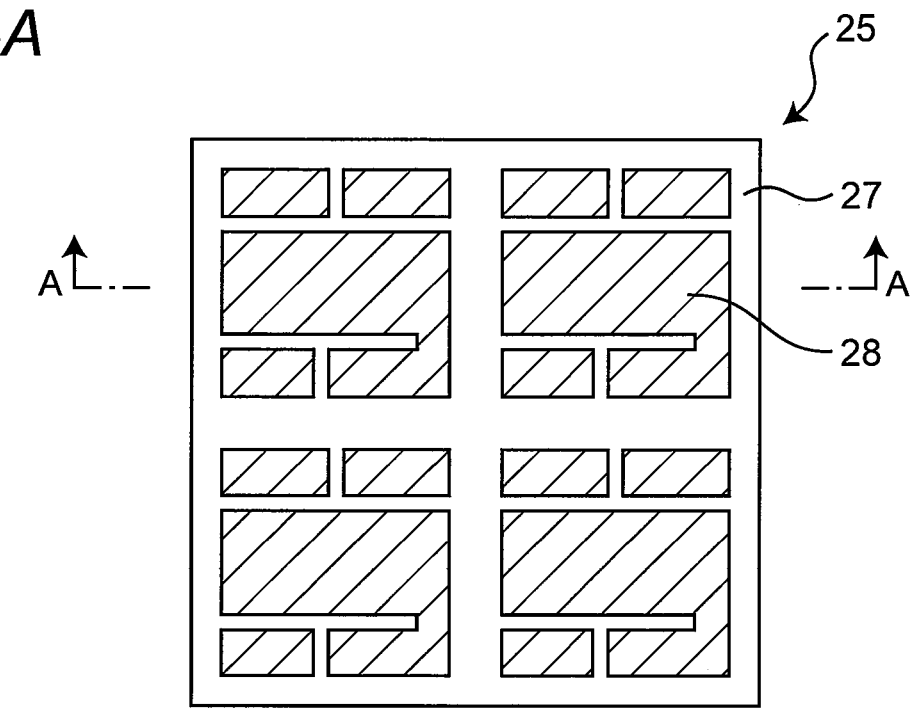
FIGS. 4A, 4B, 4C, 4D, 4E, and 4F are schematic plan views illustrating a method of manufacturing the light-emitting device according to the first embodiment.
Figure 5A:
FIG. 5A is a schematic cross-sectional view taken along line A-A of FIG. 4A.

As shown in FIG. 4A and FIG. 5A, wiring electrodes 28 (indicated by hatches in FIG. 4A) are formed in a predetermined pattern on an upper surface of a plate-shaped member 27 to provide the substrate 25.

The plate-shaped member 27 is preferably made of an insulating material, which preferably allows little of the light emitted from the light emitting elements 50 and/or external light to pass therethrough. Specific examples of such materials include ceramics made of aluminum oxide, aluminum nitride, zirconium oxide, zirconium nitride, titanium oxide, titanium nitride, or a mixture of two or more of those; resin materials such as epoxy resins, BT resins, polyimide resins; and fiber reinforced resins of those resins (including glass or alumina as a reinforcing material). Among those, glass epoxy is often used as a base material for the base member of a printed circuit board for mounting electronic elements, and is much less expensive than ceramics and metals. Also, glass epoxy has superior electrical properties and thermal properties to paper phenol that is frequently used for similar purposes, and is suitably used as a base material for the base member of a semiconductor device.

The wiring electrodes 28 may be made of an electrically conductive material, e.g., a metal such as gold, silver, copper, nickel, palladium, tungsten, chromium, titanium, aluminum, iron, tin, platinum, or rhodium, or an alloy thereof. Among those, copper or a copper alloy is preferable in view of heat dissipating performance. The wiring electrodes 28 may either be made of a single layer or two or more layers.

Forming Lateral Wall 26 on Upper Surface 25a of Substrate 25

Figure 4B:
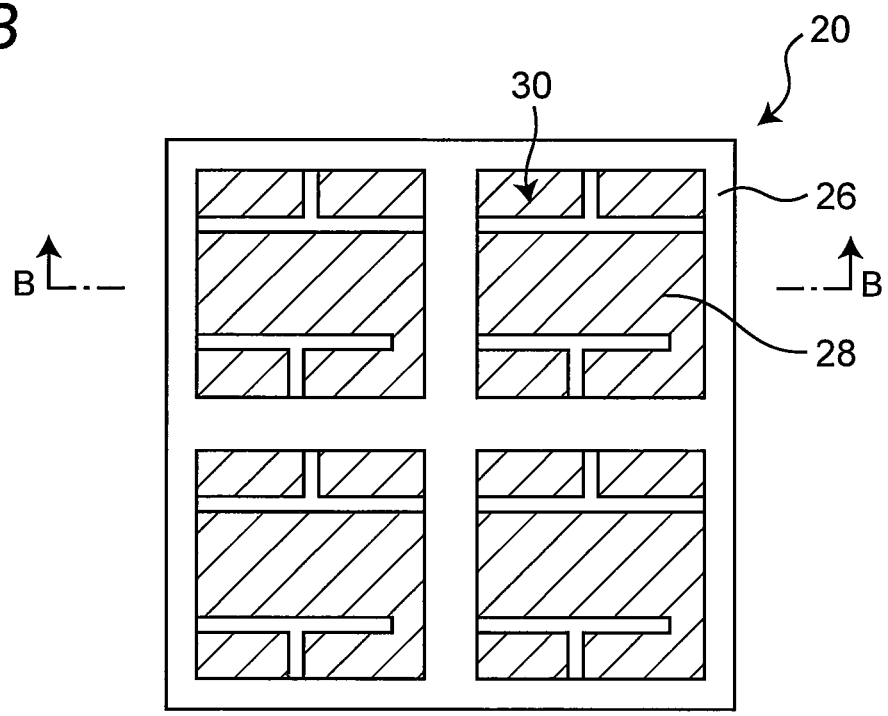

Next, as shown in FIG. 4B, a lateral wall 26 is formed in a lattice shape in a plan view on the upper surface 25a of the substrate 25, to obtain the base member 20. Preferable examples of materials for the lateral wall 26 include a silicone resin, an epoxy resin, a modified silicone resin, a modified epoxy resin, a polyimide resin, a modified polyimide resin, polyphthalamide (PPA), polycarbonate, polyphenylenesulfide (PPS), unsaturated polyester, a liquid crystal polymer (LCP), an ABS resin, a phenol resin, an acrylic resin, and a PBT resin. The lateral wall 26 is preferably made of a material having a low reflectance to external light such as sunlight, and preferably has a dark color (such as black or a nearly black color). When the light emitting device 1 is used as a single pixel of a display, the lateral wall 26 of black color or a nearly black color allows an increase in the contrast ratio of the display. The lateral wall 26 of such a dark color can be obtained by appropriately adding carbon black, a pigment, titanium oxide, silicon dioxide, zirconium oxide, potassium titanate, alumina, aluminum nitride, boron nitride, mullite, or the like to any of the resins described above.

The lateral wall 26 may be formed by way of a potting method, in which, through a dispenser, an uncured liquid resin material is applied in a predetermined pattern (e.g., in a lattice pattern) onto the upper surface 25a of the substrate 25. The lateral wall 26 may also be formed, for example, by injection molding with the use of a mold having recesses corresponding to the shape of the lateral wall 26 placed on the upper surface 25a of the substrate 25.

As described above, providing the lateral wall 26 on the upper surface of the substrate 25 allows the plate-shaped member 27 of the substrate 25 and the lateral wall 26 to be made of different materials. In other words, suitable materials can be used for the lateral wall 26 and the plate-shaped member 27, respectively. For example, a plate-shaped member 27 made of a glass epoxy resin having good electrical and thermal resistance properties can be used in combination with lateral wall 26 made of a dark-colored resin material appropriate for a wall.

Figure 5B:
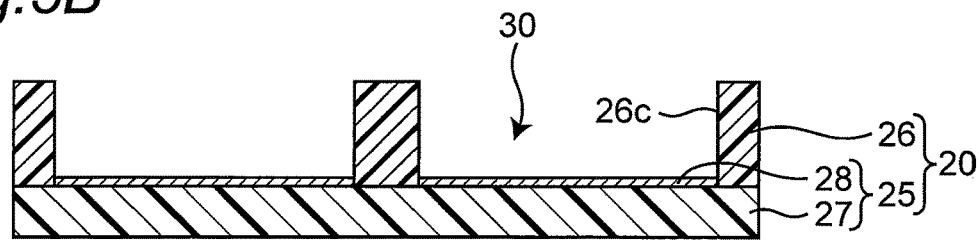
FIG. 5B is a schematic cross-sectional view taken along line B-B of FIG. 4B.

With the lateral wall 26 provided on the substrate 25, at least one first recess 30 can be defined in the base member 20, by a bottom surface of exposed portion of the upper surface 25a and the inner lateral surfaces 26c of the lateral wall 26 as shown in FIG. 5B. The lateral wall 26 is provided such that the wiring electrodes 28 on the upper surface 25a of the substrate 25 are at least partially exposed at the bottom of the first recess 30. A single base member 20 may define a single first recess 30 or a plurality of first recesses 30, but preferably has a plurality of first recesses 30. For example, the base member 20 shown in FIG. 4B has four first recesses 30, in which two adjacent first recesses 30 are preferably separated from each other by a portion of the lateral wall 26. That is to say, it is preferable that the lateral wall 26 defining the first recesses 30 also serve as the lateral wall 26 demarcating adjacent first recesses 30. In other words, a portion of lateral wall 26 defines respective portions of two adjacent first recesses, which allows a reduction in the spacing between the adjacent recesses 30. Accordingly, the use of the light emitting device 1 that employs the base member 20 for a display allows for a reduction in the spacing of the pixels, that in turn can contribute to obtaining a display that can display high-definition images.

Variation of Base Member

Figure 6:
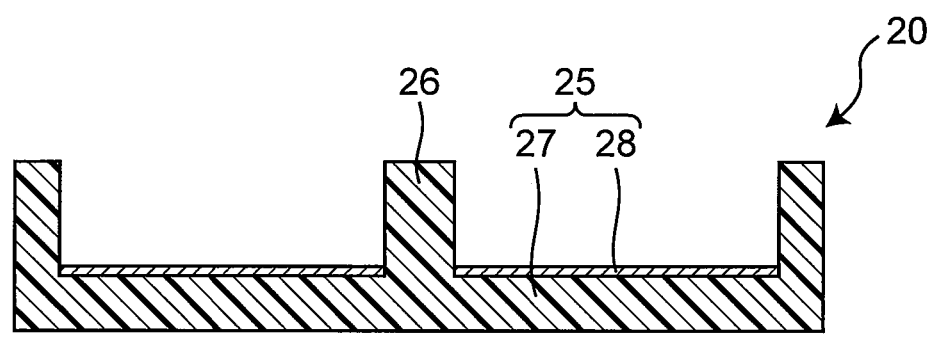
FIG. 6 is a schematic cross-sectional view illustrating a variation of a base member for the light-emitting device according to the first embodiment.

When the plate member 27 and the lateral wall 26 are made of the same material as shown in FIG. 6, the plate-shaped member 27 and the lateral wall 26 can be formed at the same time. For example, the plate-shaped member 27 and the lateral wall 26 can be formed by injection molding or the like, in which a lead frame is used as the material of the wiring electrodes 28, and portions of the lead frame corresponding to respective wiring electrodes 28 are interposed between upper and lower molds defining recesses corresponding to respective shapes of the plate-shaped member 27 and the lateral wall 26.

Forming the plate member 27 and the lateral wall 26 at the same time can simplify the manufacturing process and also can increase the bonding strength between the plate member 27 and the lateral wall 26.

Mounting Light-Emitting Elements 50 on Base Member 20

Figure 4C:
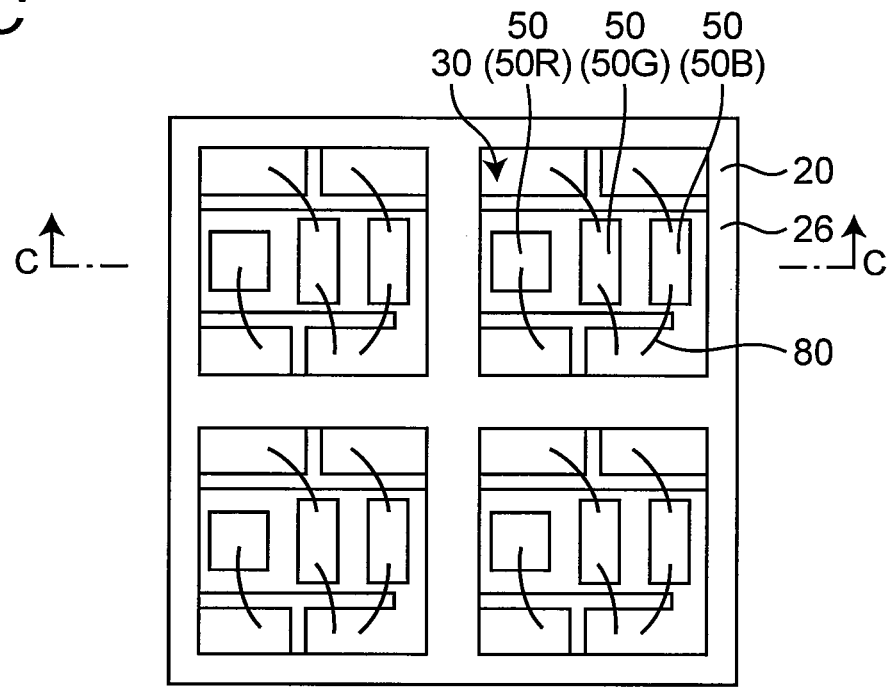
Figure 5C:
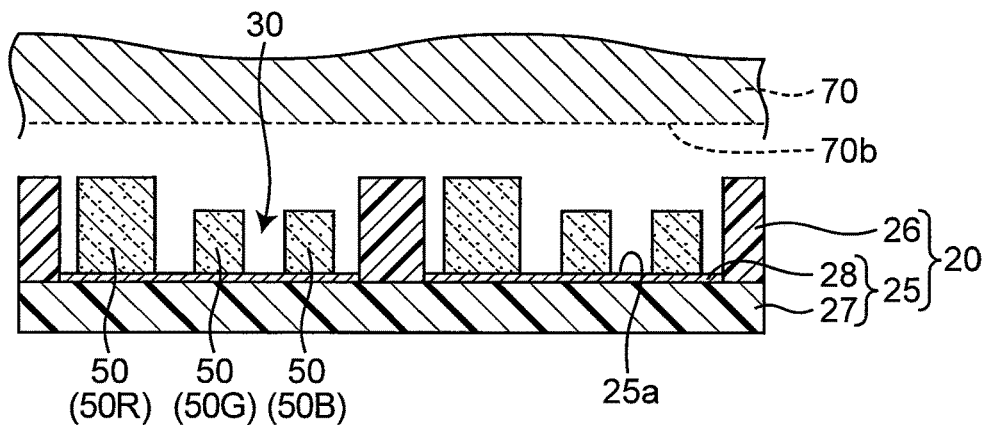
FIG. 5C is a schematic cross-sectional view taken along line C-C of FIG. 4C.

As shown in FIG. 4C and FIG. 5C, at least one light-emitting element 50 is mounted on the bottom of each of the first recesses 30 defined in the base member 20. In the example illustrated in FIG. 4C and FIG. 5C, three light-emitting elements 50 are mounted on each first recess 30.

As described above, at least portions of the wiring electrodes 28 disposed on the upper surface 25a of the substrate 25 are arranged on the bottom of each first recess 30, so that each of the light-emitting elements 50 can be mounted on corresponding portions of the wiring electrodes 28. With this configuration, for example, a light-emitting element 50 having an electrode on its lower surface, such as each of the red light-emitting elements 50R shown in FIG. 4C, can be electrically connected to corresponding wiring electrode 28. A light-emitting element 50 which does not have an electrode on its lower surface, such as each of the blue light-emitting elements 50B and green light-emitting elements 50G shown in FIG. 4C, is also preferably mounted on the wiring electrode 28. Mounting the light-emitting elements 50 on the wiring electrode 28 allows efficient dissipation of the heat generated by the light-emitting elements 50 in light-on state through the wiring electrode 28.

A light-emitting element 50 having an electrode on its upper surface has the electrode electrically connected via electrically conductive wires 80 to the respective wiring electrodes 28 exposed at the bottom of the recess 30. As described above, the light-emitting elements 50 can be electrically connected to the wiring electrodes 28, respectively. In FIG. 4C, each of the red light-emitting elements 50R has a single electrode on its upper surface, and each of the green light-emitting elements 50G and blue light-emitting elements 50B has two electrodes on its upper surface. The electrically conductive wire 80 may be made of a metal such as Au, Ag, Cu or Al or an alloy whose main component is one or more of those metals.

The light-emitting elements 50 may each include a first-conductivity type semiconductor layer 51 (e.g., n-type semiconductor layer), an active layer 52, and a second-conductivity type semiconductor layer 53 (e.g., p-type semiconductor layer), as shown in FIG. 3. The light-emitting elements 50 can be made of semiconductor materials such as a Group III-V compound semiconductor, and a Group II-VI compound semiconductor. More specifically, the red light-emitting elements 50R may be made of a compound semiconductor material such as GaAlAs or InAlGaP. The green light-emitting elements 50G and blue light-emitting elements 50B may be made of a nitride compound semiconductor material such as $In_XAl_YGa_{1-X-Y}N$ (where 0≤X, 0<Y, and X+Y<1). Examples of such nitride compound semiconductor materials include InN, AlN, GaN, InGaN, AlGaN, and InGaAlN.

Forming Light-Transmissive Layer 400

After mounting the light-emitting elements 50 in each of the plurality of first recesses 30 of the base member 20, a light-transmissive layer 400 is disposed to continuously cover the plurality of the first recesses 30. The light-transmissive layer 400 is configured to be formed into a plurality of the light-transmissive members 40 of the light-emitting device 1 (see FIG. 1B).

The light-transmissive layer 400 is disposed to cover the light-emitting elements 50 in the first recesses 30, the bottom of each of the first recesses 30 (i.e., the upper surface 25a of the substrate 25), the inner lateral surfaces 26c of the lateral wall 26, and the upper surfaces 26a of the lateral wall 26. The light-transmissive layer 400 preferably has a flat upper surface 400a, which is preferably located higher than the uppermost portion 26t of the lateral wall 26 (in FIG. 5D, the uppermost portion 26t of the lateral wall 26 is in the upper surfaces 26a of the lateral wall 26).

The light-transmissive layer 400 may be formed, for example, using a mold (assembly), as described below. As shown in FIG. 5C, a mold 70 with a flat surface 70b is placed over the base member 20 having the light-emitting elements 50 mounted thereon. At this time, the mold 70 is arranged spaced apart from the uppermost portion 26t of the lateral wall 26. With this arrangement, when a light-transmissive material is injected between the mold 70 and the base member 20, the light-transmissive material is allowed to cover the uppermost portion 26t of the lateral wall 26 and also allows the upper surface 400a of the resulting light-transmissive layer 400 to be located above the uppermost portion 26t of the lateral wall 26. Strict positioning between the mold 70 and the base member 20 is not necessary in the use of a mold 70 having a flat surface 70b. Thus, the occurrence of faulty products due to insufficient positioning between the mold 70 and the base member 20 can be reduced.

The mold 70 may have roughened surface 70b, to obtain the upper surface 400a, with which the upper surface 400a of the light-transmissive layer 400 (FIG. 5D), that is, the upper surface 40a of the light-transmissive member 40 of the light emitting device 1, can be roughened. The surface roughness Ra of the surface 70b of the mold 70 is preferably 10 μm or less, and for example, a surface roughness Ra in a range of 1 μm to 10 μm can be employed.

For the light-transmissive layer 400, a resin material having a high transmittance to the light emitted from the light-emitting elements 50 may be used, which may either be a thermosetting resin or a thermoplastic resin. In particular, the use of a thermosetting resin having good thermal resistance is preferable because it allows a reduction in degradation of the light-transmissive members 40 caused by the heat generated by the light-emitting elements 50 when lighting in the light-emitting device 1 ready for use. Examples of suitable thermosetting resins include silicon resins, modified silicone resins, epoxy resins, and phenol resins.

In order to provide a desired physical property, an appropriate additive may be included in the light-transmissive layer 400. For example, in order to adjust the refractive index of the light-transmissive layer 400, and/or to adjust the viscosity of the material of the light-transmissive layer 400, various types of filler, for example, a light-scattering agent, may be included in the light-transmissive layer 400. A light scattering agent of a large amount may cause a decrease in the light extraction efficiency, but with a small amount, the light extraction efficiency can be improved. The concentration of light scattering agent added to the light-transmissive layer 400 may be in a range of about 5% to about 60% by mass. Examples of the light scattering agent include aluminum oxide, silicon oxide, titanium oxide, and barium sulfate. The examples also include a powder of a pigment, a fluorescent substance, or the like.

Partially Removing Light-Transmissive Layer 400

Figure 4D:
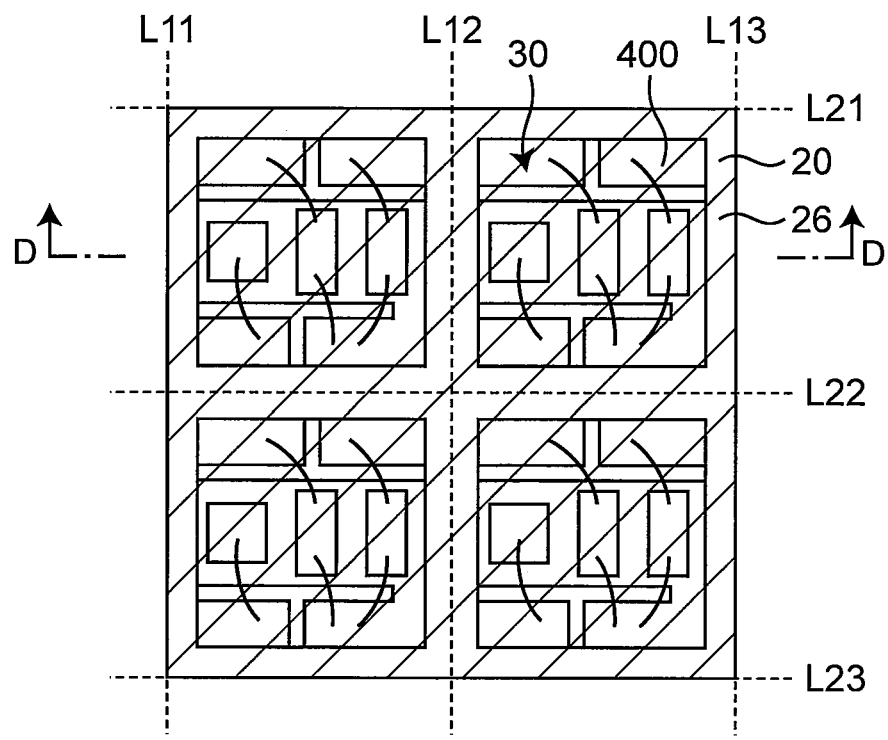
Figure 4E:
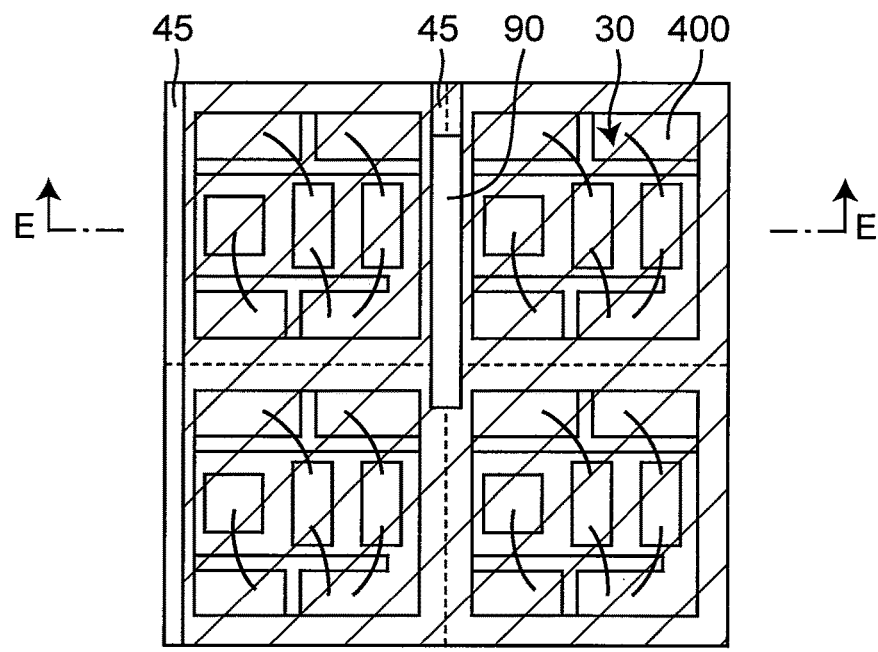
Figure 4F:
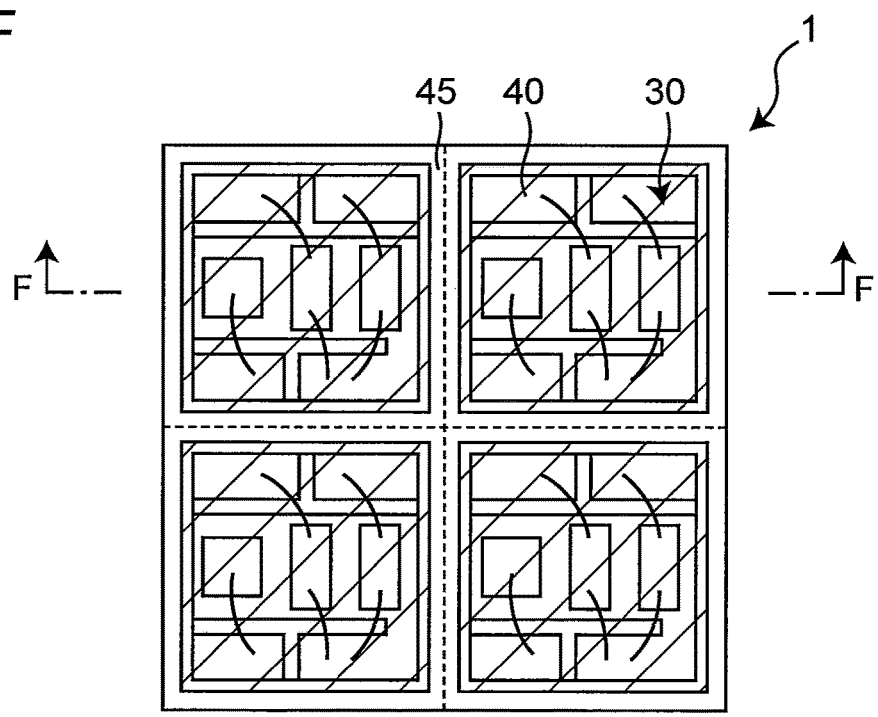
Figure 5D:
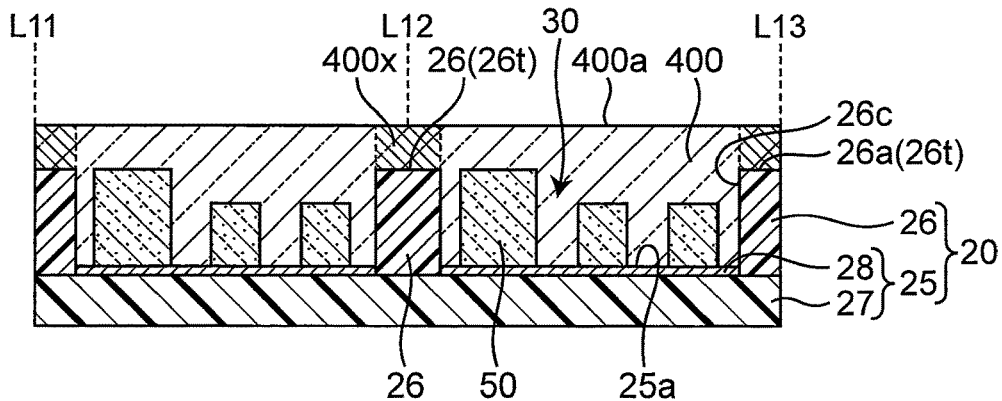
FIG. 5D is a schematic cross-sectional view taken along line D-D of FIG. 4D.
Figure 5E:
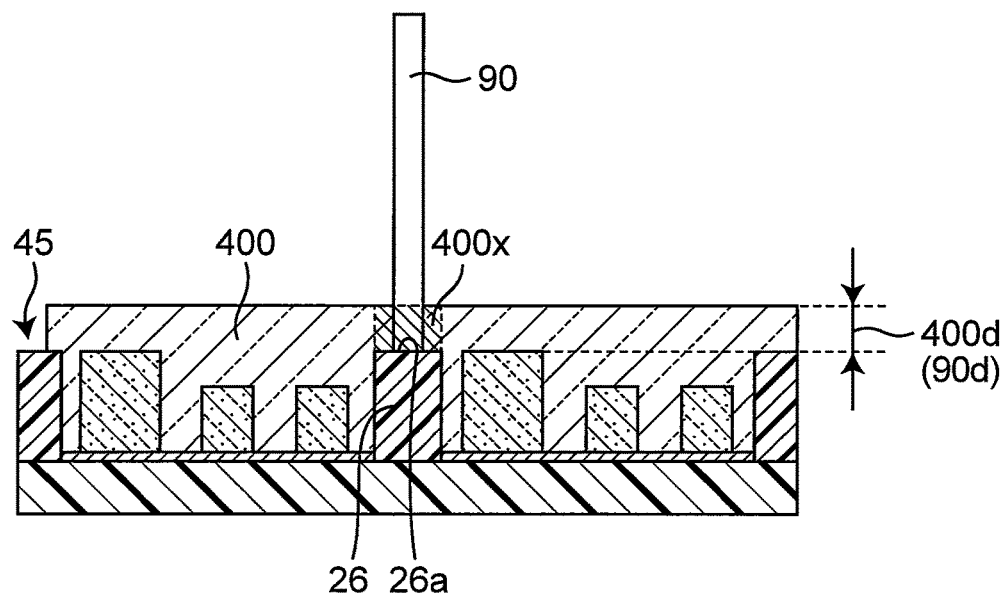
FIG. 5E is a schematic cross-sectional view taken along line E-E of FIG. 4E.

As shown in FIG. 4E and FIG. 5E, the light-transmissive layer 400 is partially removed along the upper surface 26a of the lateral wall 26 between the first recesses 30. The partial removal of the light-transmissive layer 40 may be carried out by cutting or the like with the use of a blade or a laser beam, for example. More specifically, as shown in FIG. 4D and FIG. 5D, a portion of the light-transmissive layer 400 that covers the upper surface 26a of the lateral wall 26 (hereinafter may be referred to as a "covering portion 400x") is removed along the lines L11, L12, L13, L21, L22 and L23.

As described above, the upper surface 26a of the lateral wall 26 arranged between the plurality of first recesses 30 is covered by a portion of the light-transmissive layer 400. Removing the covering portion 400x of the light-transmissive layer 400 between the first recesses 30 forms the groove 45 in the light-transmissive layer 400. The depth of each portion of the groove 45 is set to expose the lateral wall 26 at the bottom of the groove 45.

As described above, the light-transmissive layer 400 is divided into a plurality of light-transmissive members 40 by the groove 45 formed along the lateral wall 26 between the first recesses 30. That is, in the step of partially removing the light-transmissive layer 400, the covering portion 400x, that is the portion of the light-transmissive layer 400 on the lateral wall 26 arranged between the first recesses 30, is removed to expose the lateral wall 26 between the first recesses 30, and thus a plurality of light-transmissive members 40 is formed.

At this time, a portion of the light-transmissive layer 400 on the lateral wall 26 at an outer periphery of the light emitting device 1 is preferably also removed. That is, in a plan view, the lateral wall 26 is preferably not covered by the light-transmissive layer 400 at the outer periphery of the light-emitting device 1. Accordingly, when a plurality of light emitting devices 1 is arranged to provide a display, clear outlines of the light emitting parts located at the outer periphery of each light emitting device 1 can be obtained, thus increasing the sharpness of an image on the display. Thus, the light-emitting device 1 is obtained.

Variation in the Partially Removing Light-Transmissive Layer 400

In the step of partially removing the light-transmissive layer 400, the covering portion 400x of the light-transmissive layer 400 may be removed either partially or completely. In the present specification, the expression "partially removing" refers to removing a portion of the covering portion 400x in its width direction (i.e., the right and left direction in FIG. 5E).

Figure 7A:
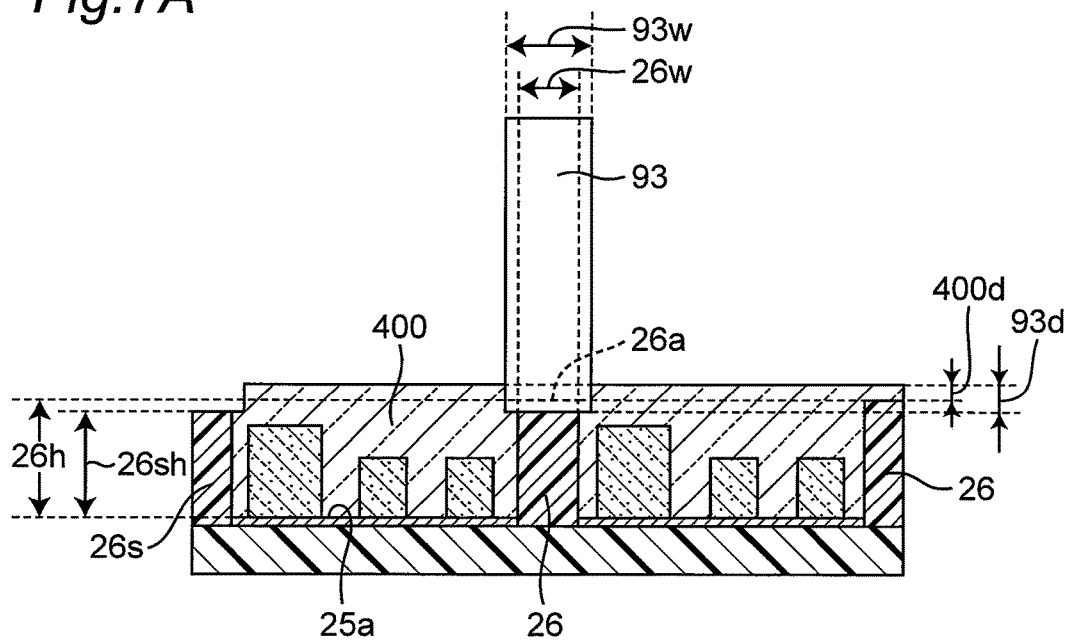
FIGS. 7A and 7B are schematic cross-sectional views illustrating a method of manufacturing a light-emitting device according to a second embodiment.
Figure 7B:
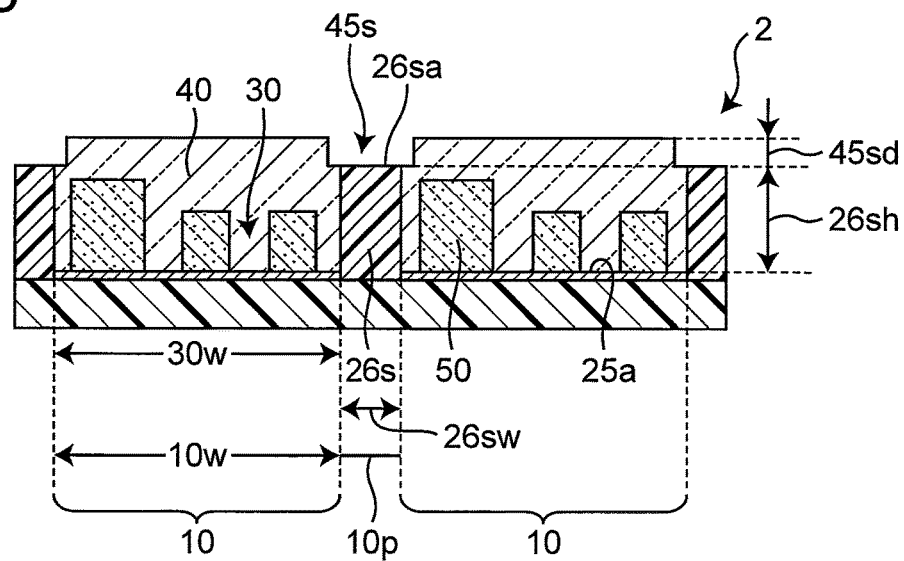

In order to completely remove the covering portion 400x, for example as shown in FIGS. 7A and 7B, a blade 93 having a blade width greater than the width 26w of the lateral wall 26 may be used. The blade width of the blade 93 is greater than the width 26w of the lateral wall 26 that is the same width as the covering portion 400x, so that the covering portion 400x can be completely removed by the blade 93.

As shown in FIG. 7A, the depth 93d of the blade 93 in the covering portion 400x (i.e., the depth 45sd of the groove 45s in FIG. 7B) may be greater than the thickness 400d of the covering portion 400x. That is, the blade 93 may remove the entire of the covering portion 400x with corresponding portion of the upper portion 26a of the lateral wall 26 to reduce the height 26h of the lateral wall 26. As shown in FIG. 7A, after removing the upper portion 26a of the lateral wall 26, the height 26sh of the lateral wall 26 is smaller than the height 26h of the lateral wall 26 before removing the upper portion 26a (i.e., height 26sh<height 26h). Thus, in the light-emitting device 2 shown in FIG. 7B, the determination of the location of the upper surface 26a of the lateral wall 26 shown in FIG. 2 and the determination of the height 26h of the lateral wall 26 shown in FIG. 3 can also be applied to the location and the height 26sh of the upper surface 26sa of the lateral wall 26s after removing the upper portion.

The example shown in FIGS. 7A and 7B can be efficient when the height 26sh of the lateral wall 26 in the light-emitting device 2 ready for use to be smaller than the height 26h of the lateral wall 26 formed in the step of providing the base member. For example, when the lateral wall 26s is disposed by potting using a dispenser or the like, difference in height of the lateral wall 26s may occur at, for example, an intersecting portion of the lateral wall 26s in a plan view. Even in such case, according to the present variation, the lateral wall 26s of approximately same height can be provided in the light emitting device ready for use.

In a plan view of the light-emitting device 2 shown in FIG. 7B, the upper surface 26sa of the lateral wall 26s can be seen at the bottom of each portion of the groove 45s. As in described above, when the light-emitting device 2 is used in a display device, adjacent light emitting parts are seen separated by respective corresponding portions of the upper surface 26sa of the lateral wall 26s. When a blade is used, a trace of the blade may be left in the upper surface 26sa, in other words, the upper surface 26sa is roughened. This configuration reduces reflection of external light at the upper surface 26sa toward the viewer, so that a display device of high contrast ratio can be provided.

In FIG. 7B, the width 10w of each light emitting part 10 corresponds to the width 30w of the first recess 30. Thus, the spacing 10p between adjacent light emitting parts 10 corresponds to the width 26sw of the lateral wall 26s.

Figure 8A:
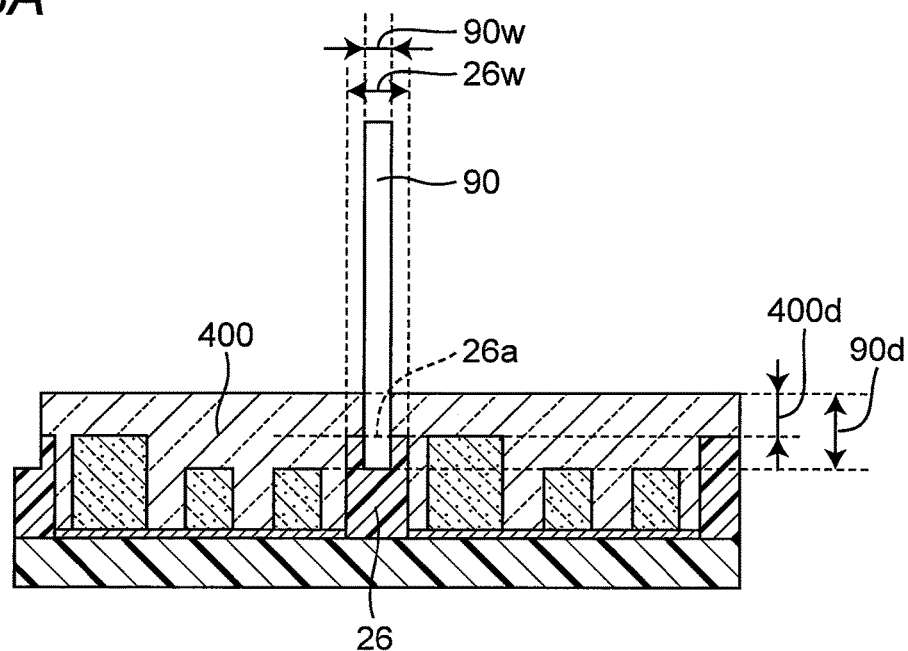
FIGS. 8A and 8B are schematic cross-sectional views illustrating a method of manufacturing a light-emitting device according to a third embodiment.
Figure 9A:
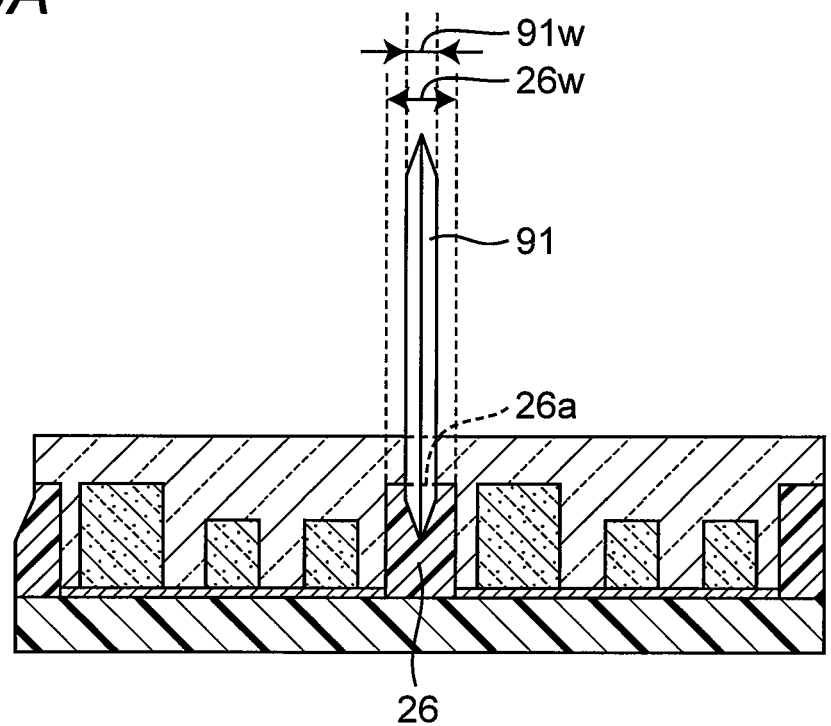
FIGS. 9A and 9B are schematic cross-sectional views illustrating a method of manufacturing a light-emitting device according to a fourth embodiment.

In order to partially remove the covering portion 400x, for example as shown in FIG. 5E, FIG. 8A, and FIG. 9A, blades 90, 91, having blade widths 90w, 91w, respectively smaller than the width 26w of the lateral wall 26 may be used. The blade widths 90w and 91w of the blades 90 and 91, respectively, are smaller than the width 26w of the lateral wall 26, where the width 26w corresponds to the width of the covering portion 400x, thus allowing the partial removal of the covering portion 400x.

Figure 5F:
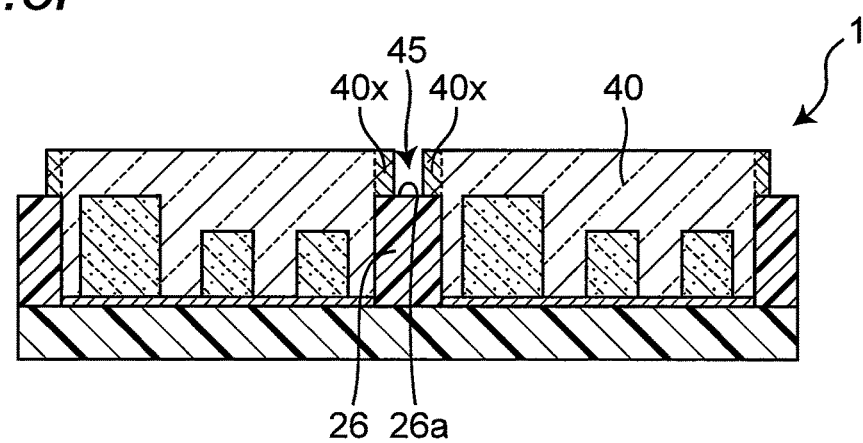
FIG. 5F is a schematic cross-sectional view taken along line F-F of FIG. 4F.

For example, as shown in FIG. 5E, a portion of the covering portion 400x (see FIG. 5D) covering the upper surface 26a of the lateral wall 26 is removed using the blade 90 to form a groove 45 in the light-transmissive layer 400 (see FIG. 5F). The portions of the covering portion 400x that have not been removed (hereinafter may be referred to as "residual covering portions 40x" of the light-transmissive member 40) are allowed to be present on the upper surface 26a of the lateral wall 26, defining both or either of the lateral sides of the grooves 45 in the light-emitting device 1 ready for use (see FIG. 5F).

Unlike the example shown in FIG. 7A, in the example shown in FIG. 5E, the depth 90d of the blade 90 (i.e., the depth 45d of the groove 45 in FIG. 5F) is substantially equal to the thickness 400d of the covering portion 400x. That is, only the covering portion 400x is removed by the blade 90 and the upper portion of the lateral wall 26 is not substantially removed. Thus, in the light-emitting device 1 as shown in FIG. 5E, the determination of the location of the upper surface 26a of the lateral wall 26 shown in FIG. 2 and the determination of the height 26h of the lateral wall 26 as shown in FIG. 3 can also be applied.

The example shown in FIG. 8A is similar to that in the example shown in FIG. 5E except the depth 90d of the blade 90. As shown in FIG. 8A, the covering portion 400x (see FIG. 5D) covering the upper surface 26a of the lateral wall 26 is partially removed with the use of the blade 90 to form the grooves 45x in the light-transmissive layer 400. The portions of the covering portion 400x that have not been removed (the residual covering portions 40x of the light-transmissive members 40) are allowed to be present on the upper surface 26a of the lateral wall 26, defining both or either of the lateral sides of the grooves 45 in the light emitting device 3 ready for use (see FIG. 8B).

Figure 8B:
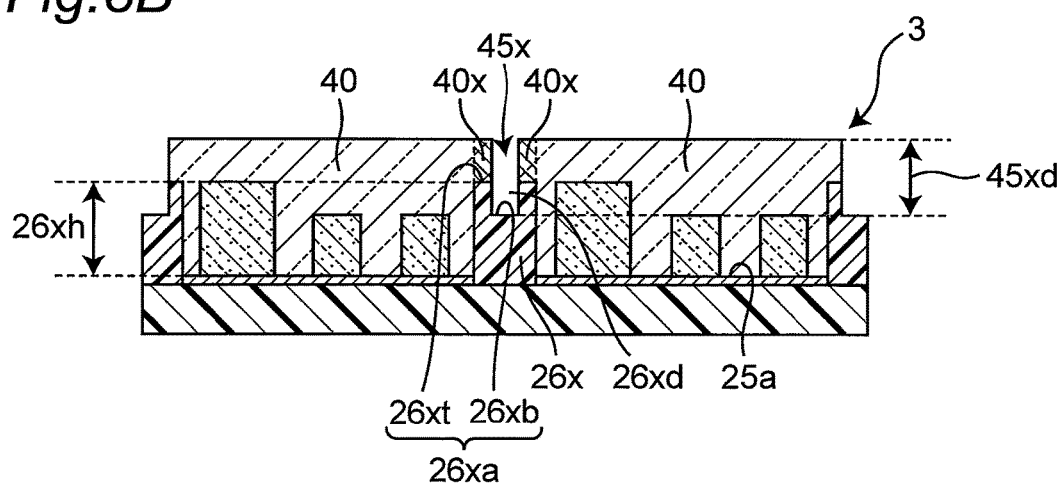

In the example shown in FIG. 8A, in a similar manner as in FIG. 7A, the depth 90d of the blade 90 (that is the depth 45d of the groove 45 in FIG. 8A) is greater than the thickness 400d of the covering portion 400x. The blade 90 may remove a portion the covering portion 400x with corresponding portion of the upper portion 26a of the lateral wall 26 to form a second recess 26xd on the upper surface 26a of the lateral wall 26. As shown in FIG. 8B, the upper surface 26xa of the lateral wall 26x includes an uppermost portion 26xt of the lateral wall 26x (i.e., a portion not removed by the blade 90) and the bottom surface 26xb of the second recess 26xd (i.e., the portion formed by the blade 90).

The uppermost portion 26xt of the lateral wall 26x is located higher than the bottom surface 26xb of the second recess 26xd. Thus, the light-shielding in the light-emitting device 3 is not substantially affected by the second recess 26xd in the lateral wall 26x, while the location of the uppermost portion 26xt of the lateral wall 26x is of importance. Thus, in the light-emitting device 3 shown in FIG. 8B, the determination of the location of the upper surface 26a of the lateral wall 26 as shown in FIG. 2 and the determination of the height 26h of the lateral wall 26 shown in FIG. 3 can also be applied to the location of the uppermost portion 26xt of the lateral wall 26z and to the height 26xh of the uppermost portion 26xt of the lateral wall 26x.

In the example shown in FIGS. 8A and 8B, the height 26h of the lateral wall 26 formed in the step of providing the base member corresponds to the height 26xh of the uppermost portion 26xt of the lateral wall 26x in the light-emitting device ready for use. When the height of the lateral wall 26 can be placed with high precision in the step of providing the base member, retaining the height in the step of selectively removing the light-transmissive layer allows for sufficiently accurate controlling of the height (that is, the height 26xh of the uppermost portion 26xt of the lateral wall 26x) of the lateral wall in terms of light-shielding.

In a top plan view of the light-emitting device 3 shown in FIG. 8B, a portion of the upper surface 26xa of the lateral wall 26x, which is the bottom surface 26xb of the second recess 26xd can be seen in each of the grooves 45x. As described above, when the light-emitting device 3 is used for a display device, adjacent light emitting parts can be seen separated from each other by corresponding portions of the bottom surface 26xb. The bottom surface 26xb has a trace of the blade 90, in other words, the bottom surface 26xb is roughened. Accordingly, the external light reflected at the bottom surface 26xb toward the viewer can be reduced, so that a display with higher contrast ratio can be provided.

Further, as shown in FIG. 5E, a very precise controlling is required to control the depth 90d of the blade 90 so as not to remove the upper portion 26a of the lateral wall 26, while penetrating the covering portion 400x of the light-transmissive layer 400, in other words, while removing the entire of the covering portion 400x in its thickness direction. On the other hand, it is advantageous, as shown in FIG. 8A, when the depth 90d of the blade 90 is greater than the thickness 400d of the covering portion 400x because it allows the blade 90 penetrating the entire depth of the covering portion 400x while tolerating the variation in the blade depth 90d.

The example shown in FIG. 9A is similar to that in the example shown in FIG. 5E except the shape of the blade 91. The blade 91 shown in FIG. 9A has a peripheral cutting edge, which can reduce the stress applied to the blade 91 at the time of removing the light-transmissive layer 400 and the lateral wall 26.

Figure 9B:
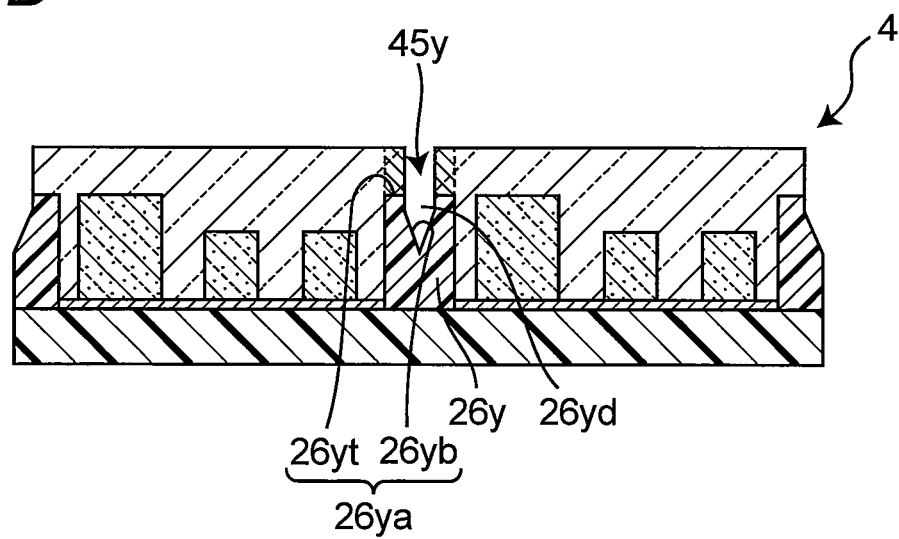

The light-emitting device 4 shown in FIG. 9B exhibits similar effects as that of the light emitting device 3 shown in FIG. 8B, such as in controlling the height of the lateral wall in terms of light-shielding, reduction in reflecting external light toward the viewer, and tolerating the variation in the blade depth. In particular, reduction in reflecting external light toward the viewer can be more significant than that in the light emitting device 3 shown in FIG. 8B. The detail will be described below.

As shown in FIG. 9B, the upper surface 26ya of the lateral wall 26y includes an uppermost portion 26yt of the lateral wall 26y (i.e., a portion not removed by the blade 91) and a bottom surfaces 26yb of a second recess 26yd (i.e., a portion formed by the blade 91). The bottom surface 26yb of the second recess 26yd may have a cross sectional shape corresponding to the shape of the cutting edge of the blade 91, e.g., a V-shaped cross-section.

In the light-emitting device 4 shown in FIG. 9B, as in the light-emitting device 3 shown in FIG. 8B, the bottom surface 26yb of the second recess 26yd has a trace of the blade 91, in other words, the bottom surface 26yb is roughened. Accordingly, the external light reflected at the bottom surface 26yb toward the viewer can be reduced. Further, in the light-emitting device 4 shown in FIG. 9B, the bottom surface 26yb is formed in a V-shape, so that external light incident on the groove 45y from above is not simply reflected back upward.

As described above, in the light-emitting device 4 shown in FIG. 9B, the bottom surface 26yb of the second recess 26yd of the upper surface 26ya of the lateral wall 26y is roughened and sloped, so that external light incident on the bottom surface 26yb of the second recess 26yd in the groove 45y is not simply reflected toward the opening of the groove 45y. Thus, a display with higher contrast ratio can be provided.

Figure 10A:
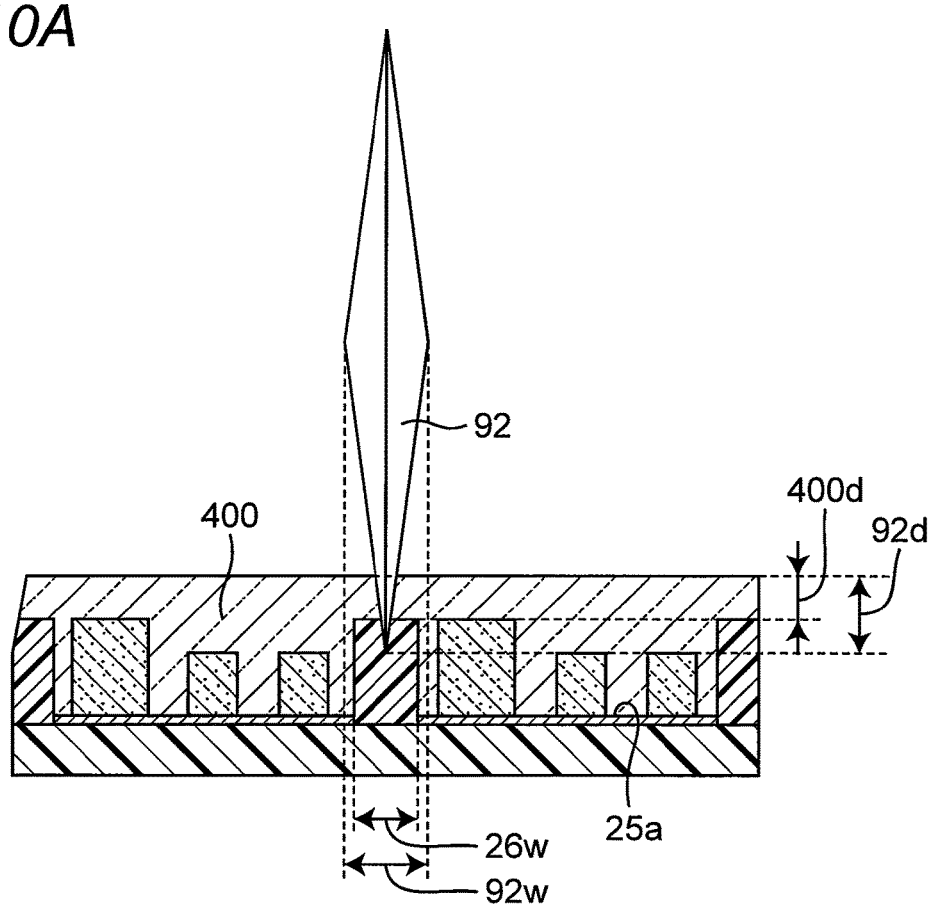
FIGS. 10A and 10B are schematic cross-sectional views illustrating a method of manufacturing a light-emitting device according to a fifth embodiment.

The covering portion 400x may also be partially removed by using a blade 92 having inclined lateral surfaces to form a sharp cutting edge, for example, as shown in FIG. 10A. As the blade 91 shown in FIG. 9A, the blade 92 also has an outer peripheral cutting edge, which is sharper than that of the blade 91. Although the blade width 92w of the blade 92 is greater than the width 26w of the lateral wall 26, a portion of the blade 92 sinking into the lateral wall 26 is narrower than the width 26w of the lateral wall 26. Thus, the covering portion 400x can be partially removed as shown in FIGS. 10A and 10B.

Figure 10B:
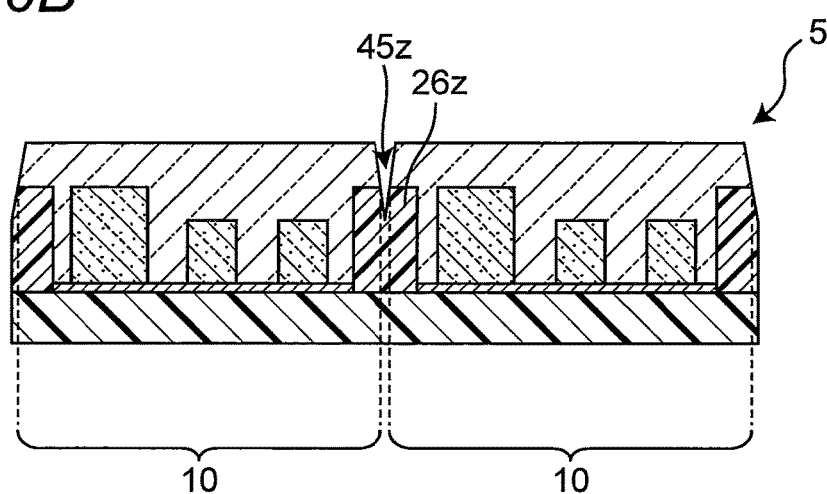

The light-emitting device 5 shown in FIG. 10B has the same advantages (including reducing the stress applied to the blade during cutting, controlling the substantial height of the lateral wall, reducing external light reflection, and allowing some variation in the blade's penetration depth) as the light-emitting device 4 shown in FIG. 9B. Further, in the light emitting device 5 shown in FIG. 10B, the sharper the cutting edge of the blade 92, the narrower the width of the grooves 45z, allowing narrowing the interval between adjacent light emitting parts 10.

As described above, the grooves provided in the light emitting device can be formed with desired shapes and dimensions by appropriately selecting the blade edge angle and/or the blade width, and/or adjusting the blade depth.

Variations

In the first embodiment, a method of manufacturing a light-emitting device 1 having a plurality of light emitting parts 10 is illustrated. The first embodiment can be modified to facilitate manufacturing a light-emitting device having a single light emitting part 10.

The steps of providing the base member, mounting the light emitting elements, and disposing the light-transmissive layer, may be performed as in the first embodiment.

Figure 11A:
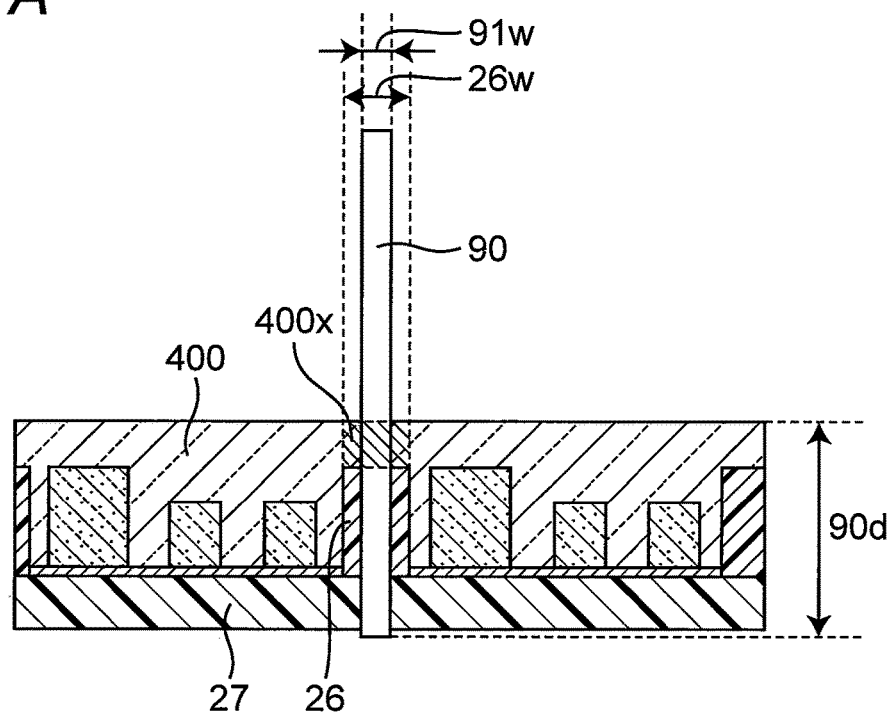
FIGS. 11A and 11B are schematic cross-sectional views illustrating a method of manufacturing a light-emitting device according to a sixth embodiment.
Figure 11B:
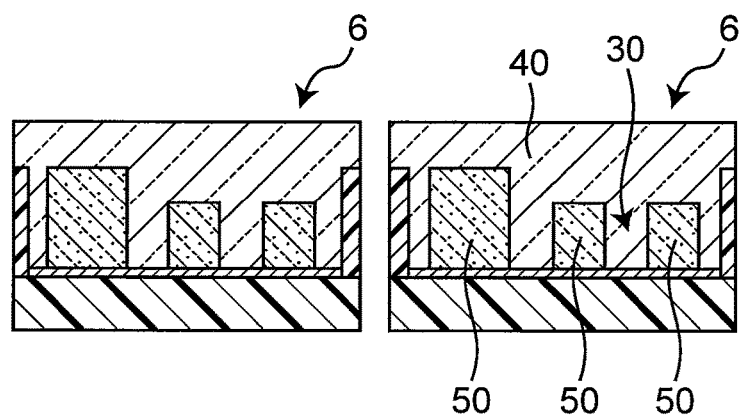

In the step of partially removing the light-transmissive layer, as shown in FIG. 11A, a blade 90 or 91 having a blade width smaller than the width 26w of the lateral wall 26 may be used. In this variation, the depth 90d or 91d of the blade 90 or 91 is increased to penetrate through the covering portion 400x of the light-transmissive layer 400, the lateral wall 26, and the plate member 27. Accordingly, adjacent light emitting parts 10 can be separated into individual light emitting devices 6. Each light-emitting device 6 thus fabricated has a single first recess 30, at least one light-emitting element 50 arranged in the first recess 30, and a single light-transmissive member 40 covering the first recess 30.

The light-emitting device and method of manufacturing the device according to the embodiments of the present invention can be preferably applied for displays and also for light sources for lighting, light sources of backlights, and so forth.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it is to be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method of manufacturing a light-emitting device having a plurality of light-emitting parts, the method comprising:
    providing a base member having a plurality of recesses each defined by a bottom surface and lateral surfaces that are inner lateral surfaces of a lateral wall separating adjacent recesses of the plurality of recesses;
    mounting at least one light-emitting element in each of the plurality of recesses;
    forming a light-transmissive layer continuously covering the plurality of recesses; and
    at least partially removing portions of the light-transmissive layer on the lateral wall between the adjacent recesses to expose at least portions of the lateral wall so as to form a plurality of light-transmissive members,
    wherein the forming the plurality of light-transmissive members comprises:
    removing a part of the light-transmissive layer on the lateral wall between the plurality of recesses as well as a part of an upper surface of the lateral wall by using a blade to form a groove dividing the light-transmissive layer on the lateral wall and to form a second recess on the upper surface of the lateral wall, said second recess being exposed from the light-transmissive layer to form the plurality of light-transmissive members.

2. The method according to claim 1, wherein the providing the base member comprises:
    providing a substrate having an upper surface that defines the bottom surfaces of the plurality of recesses; and
    forming the lateral wall on the upper surface of the substrate, the lateral wall including inner lateral surfaces that define the lateral surfaces of the plurality of recesses.

3. The method according to claim 1, wherein the forming the light-transmissive layer includes forming the light-transmissive layer having a substantially flat upper surface that is higher than an upper surface of the lateral wall.

4. The method according to claim 1, wherein a surface of the lateral wall exposed from the light-transmissive layer is roughened.

5. The method according to claim 1, wherein the second recess has a V-shaped cross-section.

6. The method according to claim 1, wherein the mounting at least one light-emitting element comprises: mounting the light-emitting element so that an uppermost portion of the lateral wall is located higher than an active layer of the light-emitting element.

7. The method according to claim 1, wherein the mounting at least one light-emitting element comprises: mounting three colors of light emitting elements of a red light-emitting element, a green light-emitting element and a blue light-emitting element in each of the plurality of recesses.

8. The method according to claim 1, wherein the lateral wall is made of dark-colored or black-colored resin material.

9. A method of manufacturing a light-emitting device having a plurality of light-emitting parts, the method comprising:
    providing a base member having a plurality of recesses each defined by a bottom surface and lateral surfaces that are inner lateral surfaces of a lateral wall separating adjacent recesses of the plurality of recesses;
    mounting at least one light-emitting element in each of the plurality of recesses;
    forming a light-transmissive layer continuously covering the plurality of recesses; and
    at least partially removing portions of the light-transmissive layer on the lateral wall between the adjacent recesses to expose at least portions of the lateral wall so as to form a plurality of light-transmissive members,
    wherein the lateral wall is made of dark-colored or black-colored resin material.

10. The method according to claim 9, wherein the providing the base member comprises:
    providing a substrate having an upper surface that defines the bottom surfaces of the plurality of recesses; and
    forming the lateral wall on the upper surface of the substrate, the lateral wall including inner lateral surfaces that define the lateral surfaces of the plurality of recesses.

11. The method according to claim 9, wherein the forming the light-transmissive layer includes forming the light-transmissive layer having a substantially flat upper surface that is higher than an upper surface of the lateral wall.

12. The method according to claim 9, wherein a surface of the lateral wall exposed from the light-transmissive layer is roughened.

13. The method according to claim 9,
    wherein the forming the plurality of light-transmissive members comprises:
    removing a part of the light-transmissive layer on the lateral wall between the plurality of recesses as well as a part of an upper surface of the lateral wall by using a blade to form a groove dividing the light-transmissive layer on the lateral wall and to form a second recess on the upper surface of the lateral wall, said second recess being exposed from the light-transmissive layer to form the plurality of light-transmissive members, and
    wherein the second recess has a V-shaped cross-section.

14. The method according to claim 9, wherein the mounting at least one light-emitting element comprises: mounting the light-emitting element so that an uppermost portion of the lateral wall is located higher than an active layer of the light-emitting element.

15. The method according to claim 9, wherein the mounting at least one light-emitting element comprises: mounting three colors of light emitting elements of a red light-emitting element, a green light-emitting element and a blue light-emitting element in each of the plurality of recesses.

* * * * *